(12) United States Patent
Sugano et al.

(10) Patent No.: US 6,215,687 B1
(45) Date of Patent: Apr. 10, 2001

(54) SEMICONDUCTOR DEVICE AND PROCESS FOR MANUFACTURING THE SAME

(75) Inventors: Toshio Sugano, Kodaira; Seiichiro Tsukui, Sayama; Kensuke Tsuneda, Kokubunji, all of (JP)

(73) Assignees: Hitachi, Ltd., Tokyo; Hitachi Tohbu Semiconductor, Ltd., Saitama, both of (JP)

( * ) Notice: Subject to any disclaimer, the term of this patent is extended or adjusted under 35 U.S.C. 154(b) by 0 days.

(21) Appl. No.: 09/512,476

(22) Filed: Feb. 24, 2000

Related U.S. Application Data

(62) Division of application No. 08/806,674, filed on Feb. 26, 1997.

(30) Foreign Application Priority Data

Feb. 26, 1996 (JP) .................................................. 8-037764
Aug. 22, 1996 (JP) .................................................. 8-221503

(51) Int. Cl.[7] ...................................................... G11C 5/02
(52) U.S. Cl. ................................................................ 365/52
(58) Field of Search ................................... 365/51, 52, 63, 365/230.03

(56) References Cited

U.S. PATENT DOCUMENTS

| | | | |
|---|---|---|---|
| 4,007,452 | 2/1977 | Hoff, Jr. | 365/63 |
| 4,752,911 | 6/1988 | Prevost et al. | 365/52 |
| 5,272,664 | 12/1993 | Alexander et al. | 365/52 |
| 5,280,193 | 1/1994 | Lin et al. | 257/723 |
| 5,283,885 | 2/1994 | Hollerbauer | 365/52 |
| 5,319,591 | 6/1994 | Takeda et al. | 365/63 |
| 5,513,135 | 4/1996 | Dell et al. | 365/52 |
| 5,572,457 | 11/1996 | Michael | 365/52 |
| 5,745,426 | 4/1998 | Sekiyama | 365/63 |
| 5,768,173 | 6/1998 | Seo et al. | 365/52 |
| 5,841,686 | 11/1998 | Chu et al. | 365/51 |
| 5,847,985 | * 12/1998 | Mitani et al. | 365/63 |
| 5,859,792 | 1/1999 | Rondeau, II et al. | 365/52 |
| 5,987,623 | * 11/1999 | Ushida | 365/63 |

FOREIGN PATENT DOCUMENTS

| | | |
|---|---|---|
| 0476685 | 3/1992 | (EP) . |
| 270549 | 11/1994 | (FR) . |
| 59-75494 | 4/1984 | (JP) . |
| 61-59682 | 3/1986 | (JP) . |
| 6-334112 | 12/1994 | (JP) . |

* cited by examiner

*Primary Examiner*—Trong Phan
(74) *Attorney, Agent, or Firm*—Antonelli, Terry, Stout & Kraus, LLP

(57) ABSTRACT

A memory module MM, in which a module wiring substrate 5 is equipped with function switching means KK1 and KK2 for arbitrarily switching function switching signals to be inputted to function switching pins FP0 and FP1 of memories 1. By these function switching means KK1 and KK2, moreover, the function switching signals are arbitrarily switched from any of no connection, a supply voltage Vcc and a ground potential Vss. These signals are inputted altogether to all the mounted memories 1 to switch and arbitrarily set functions including reading modes and refresh cycles.

11 Claims, 19 Drawing Sheets

FIG. 4

| INPUT VOLTAGE | | | | MODE |
|---|---|---|---|---|
| FP0 | FP1 | FP2 | FP3 | |
| OPEN | OPEN | Vss | OPEN | X 1/4K cycle refresh / FAST PAGE |
| Vss | OPEN | Vss | OPEN | X 1/4K cycle refresh / EDO |
| OPEN | Vcc | OPEN | OPEN | X 4/2K cycle refresh / FAST PAGE |
| Vss | Vcc | OPEN | OPEN | X 4/2K cycle refresh / EDO |
| OPEN | OPEN | OPEN | OPEN | X 4/4K cycle refresh / FAST PAGE |
| Vss | OPEN | OPEN | OPEN | X 4/4K cycle refresh / EDO |
| OPEN | Vcc | OPEN | Vcc | X 8/2K cycle refresh / FAST PAGE |
| Vss | Vcc | OPEN | Vcc | X 8/2K cycle refresh / EDO |
| OPEN | OPEN | OPEN | Vcc | X 8/4K cycle refresh / FAST PAGE |
| Vss | OPEN | OPEN | Vcc | X 8/4K cycle refresh / EDO |

SEMICONDUCTOR DEVICE AND PROCESS FOR MANUFACTURING THE SAME

CROSS-REFERENCE TO RELATED APPLICATION

This application is a divisional of application Ser. No. 08/806,674 filed on Feb. 26, 1997, the entire disclosure of which is hereby incorporated by reference.

BACKGROUND OF THE INVENTION

The present invention relates to a semiconductor device and a process for manufacturing it and, more particularly, to a technique which is effective if applied for switching the functions and word structures of a memory module including a plurality of semiconductor devices.

According to our investigations, the memory module to be used as an extended memory in a personal computer or a work station is constructed by mounting, on a module wiring substrate, a memory or a DRAM (dynamic random access memory) semiconductor device, made of a SOJ (small outline package) type resin-sealed package, for example.

In order that the memory module may have specifications conforming to the device to be used, there is mounted on the aforementioned module wiring substrate a memory in which the functions are switched in the refresh cycle, such as a refreshing operation cycle or a reading mode, such as FAST PAGE or EDO (extended data out).

The switching of these functions of the memory is executed by connecting a predetermined electrode in a semiconductor chip through a bonding wire with a supply voltage Vcc or a ground potential Vss or no connection terminal (NC) in the bonding step for packaging.

As another method of switching the aforementioned memory functions, moreover, there is known both a memory for selecting a predetermined reading mode in dependence upon a predetermined signal fed from the outside of the memory, as disclosed in Japanese Patent Laid-Open No. 75494/1984, and a memory for designating a bit length mode programmably on the basis of a predetermined signal, as disclosed in Japanese Patent Laid-Open No. 59682/1986. On the other hand, a memory module also is disclosed in Japanese Patent Laid-Open No. 334112/1994.

Incidentally, a memory extended system of this kind is disclosed in detail, for example, on pp. 114 to 126 of "Semiconductor MOS Memory and Its Use", as issued on Aug. 30, 1990 by Nikkan Kogyo Shinbunsha and edited by Yasoji Suzuki. This publication describes the circuit construction and operations of a memory extending DRAM board.

SUMMARY OF THE INVENTION

Incidentally, it has been found by us that the aforementioned memory module has the following problem.

The memory, as used in a memory module to be used as the extended memory of a personal computer or the like, has a variety of function switching operations. However, the memory module, as mounted as a complete product on the module wiring substrate, cannot switch the functions. Thus, the memory modules are assembled for the individual functions, and there arises a problem that the degree of freedom for the production is degraded.

An object of the present invention is to provide a memory module, in which the individual functions and word structures can be arbitrarily switched outside of the package, and a process for manufacturing the memory module.

The aforementioned and other objects and novel features of the present invention will become apparent from the following description to be made with reference to the accompanying drawings.

A summary of the representative features of the invention to be disclosed herein will be briefly described in the following.

A memory module according to the present invention comprises at least one semiconductor device including function switching external terminals for selecting a function in dependence upon the state of a function switching signal; and a printed-wiring substrate with the semiconductor device mounted thereon and including function switching means for selecting an arbitrary function switching signal to be inputted to the function switching external terminals.

According to the present invention, moreover, the function switching means includes a first node formed on the printed-wiring substrate and electrically connected with the function switching external terminal of the semiconductor device, as mounted on the printed-wiring substrate; a second node formed on the printed-wiring substrate and connected with a supply voltage; and a third node formed on the printed-wiring substrate and connected with a reference voltage, and the function switching means is a means for switching the function switching signals altogether, as inputted to the function switching external terminals, with or without conducting means provided between the first node and the second node or the third node.

According to the present invention, moreover, the function switching means is arranged at or in the vicinity of a corner portion of the printed-wiring substrate.

According to the present invention, moreover, the function of the semiconductor device to be switched by the function switching means includes a reading mode.

According to the present invention, moreover, the function of the semiconductor device to be switched by the function switching means includes a refresh cycle.

According to the present invention, moreover, the function of the semiconductor device to be switched by the function switching means includes a reading mode and a refresh cycle.

According to the present invention, moreover, the semiconductor device further includes word structure switching external terminals for selecting a word structure in dependence upon the state of a word structure switching signal, and the printed-wiring substrate further includes a word structure setting circuit for inputting a preset word structure switching signal to the word structure switching external terminals.

According to the present invention, a memory module comprises at least one semiconductor device including word structure switching external terminals for selecting a word structure in dependence upon the state of a word structure switching signal; and a dedicated printed-wiring substrate with the semiconductor device mounted thereon and including dedicated lines corresponding to the switched word structure of the semiconductor device.

According to the present invention, moreover, the memory module further comprises word structure switching means mounted on the dedicated printed-wiring substrate for selecting an arbitrary word structure switching signal to be inputted to the word structure switching external terminals.

According to the present invention, moreover, the word structure switching means includes a word structure setting circuit wired on the dedicated printed-wiring substrate and adapted to be switched to a predetermined word structure by mounting the semiconductor device so that a predetermined word structure switching signal is inputted to the word structure switching external terminals.

According to the present invention, moreover, the word structure switching means includes a fourth node formed on the dedicated printed-wiring substrate and electrically connected with the word structure switching external terminal of the semiconductor device, as mounted on the dedicated printed-wiring substrate; a fifth node formed on the dedicated printed-wiring substrate and connected with a supply voltage; and a sixth node formed on the dedicated printed-wiring substrate and connected with a reference voltage, and the word structure switching means is a means for switching the word structure switching signals altogether, as inputted to the word structure switching external terminals, with or without conducting means provided between the fourth node and the firth node or the sixth node.

According to the present invention, moreover, the semiconductor device further includes function switching external terminals for selecting a function in dependence upon the state of a function switching signal, and the dedicated printed-wiring substrate further includes function switching means for selecting an arbitrary function switching signal to be inputted to the function switching external terminals.

According to the present invention, moreover, the function switching means includes a first node (or electrode) formed on the dedicated printed-wiring substrate and electrically connected with the function switching external terminal of the semiconductor device, as mounted on the dedicated printed-wiring substrate; a second node (or electrode) formed on the dedicated printed-wiring substrate and connected with a supply voltage; and a third node (or electrode) formed on the dedicated printed-wiring substrate and connected with a reference voltage (or ground potential), and the function switching means is a means for switching the function switching signals altogether, as inputted to the function switching external terminals, with or without conducting means provided between the first node and the second node or the third node.

According to the present invention, moreover, the function of the semiconductor device to be switched by the function switching means includes a reading mode.

According to the present invention, moreover, the function of the semiconductor device to be switched by the function switching means includes a refresh cycle.

According to the present invention, moreover, the function of the semiconductor device to be switched by the function switching means includes a reading mode and a refresh cycle.

According to the present invention, moreover, the function switching means includes a function setting circuit wired on the dedicated printed-wiring substrate and adapted to be switched to a predetermined function by mounting the semiconductor device so that a predetermined function switching signal is inputted to the function switching external terminals.

According to the present invention, a process for manufacturing a memory module comprises the step of preparing a semiconductor device for selecting a predetermined word structure on the basis of a word structure switching signal, as inputted to word structure switching external terminals, and a plurality of kinds of dedicated printed-wiring substrates corresponding to a plurality of word structures, and selecting one of the dedicated printed-wiring substrates, corresponding to a demanded word structure of the semiconductor device, from the plurality of kinds of dedicated printed-wiring substrates; and the step of mounting the semiconductor device on the selected one of the dedicated printed-wiring substrates.

According to the present invention, moreover, a process for manufacturing a memory module comprises the step of preparing a semiconductor device for switching a word structure on the basis of a word structure switching signal, as inputted to word structure switching external terminals, and for selecting a function on the basis of a function switching signal, as inputted to function switching external terminals, function switching means for selecting an arbitrary function switching signal, as inputted to the function switching external terminals, with or without conducting means provided, and a plurality of kinds of dedicated printed-wiring substrates corresponding to a plurality of word structures, and selecting one of the dedicated printed-wiring substrates, corresponding to a demanded word structure of the semiconductor device, from the plurality of kinds of dedicated printed-wiring substrates; the step of mounting the semiconductor device on the selected one of the dedicated printed-wiring substrates; and the step of switching an arbitrary function selectively, with or without the conducting means provided.

According to the present invention, moreover, a process for manufacturing a memory module comprises the step of preparing a semiconductor device for selecting a predetermined word structure on the basis of a word structure switching signal, as inputted to word structure switching external terminals, and for switching a predetermined function on the basis of a function switching signal, as inputted to function switching external terminals, and a plurality of kinds of dedicated printed-wiring substrates corresponding to the switching operations of a plurality of word structures and a plurality of functions, and selecting one of the dedicated printed-wiring substrates, corresponding to a demanded word structure of the semiconductor device and the switching operation of the function, from the plurality of kinds of dedicated printed-wiring substrates; and the step of mounting the semiconductor device on the selected one of the dedicated printed-wiring substrates.

As described above, it is possible to improve the efficiency in the product development of the semiconductor device and to facilitate the product management thereby to reduce the cost.

BRIEF DESCRIPTION OF THE DRAWINGS

FIG. 4 is a table showing the mode switching operations of the memory according to Mode 1 of an Embodiment of the present invention;

DESCRIPTION OF THE PREFERRED EMBODIMENTS

In the present Mode 1 of an Embodiment, a memory 1, made of a TCP (tape carrier package) type DRAM semiconductor device or a kind of surface mount package, has bonding pads BP or electrodes which are arranged at the central portion of a semiconductor chip 2.

On the other hand, the memory 1 is given such a structure that the aforementioned semiconductor chip 2 is mounted on the tape carriers which are prepared by forming the wiring lines 4 of copper foil as leads repeatedly over the upper face of a film of polyimide.

Moreover, the bonding pads BP, arranged on the semiconductor chip 2, are individually electrically connected with inner leads 4a, formed in the tape carriers, at the leading end portions of the wiring lines 4. Still moreover, the inner leads 4a are extended to form outer leads 4b to be electrically connected with external connection electrodes, such as lands, formed on the later-described module wiring substrate.

On the other hand, the semiconductor chip 2 and the inner leads 4a are sealed with an epoxy resin, for example, to form a package, and the individual leads, protruding from the package, are bent generally in a crank shape.

Figure 1:
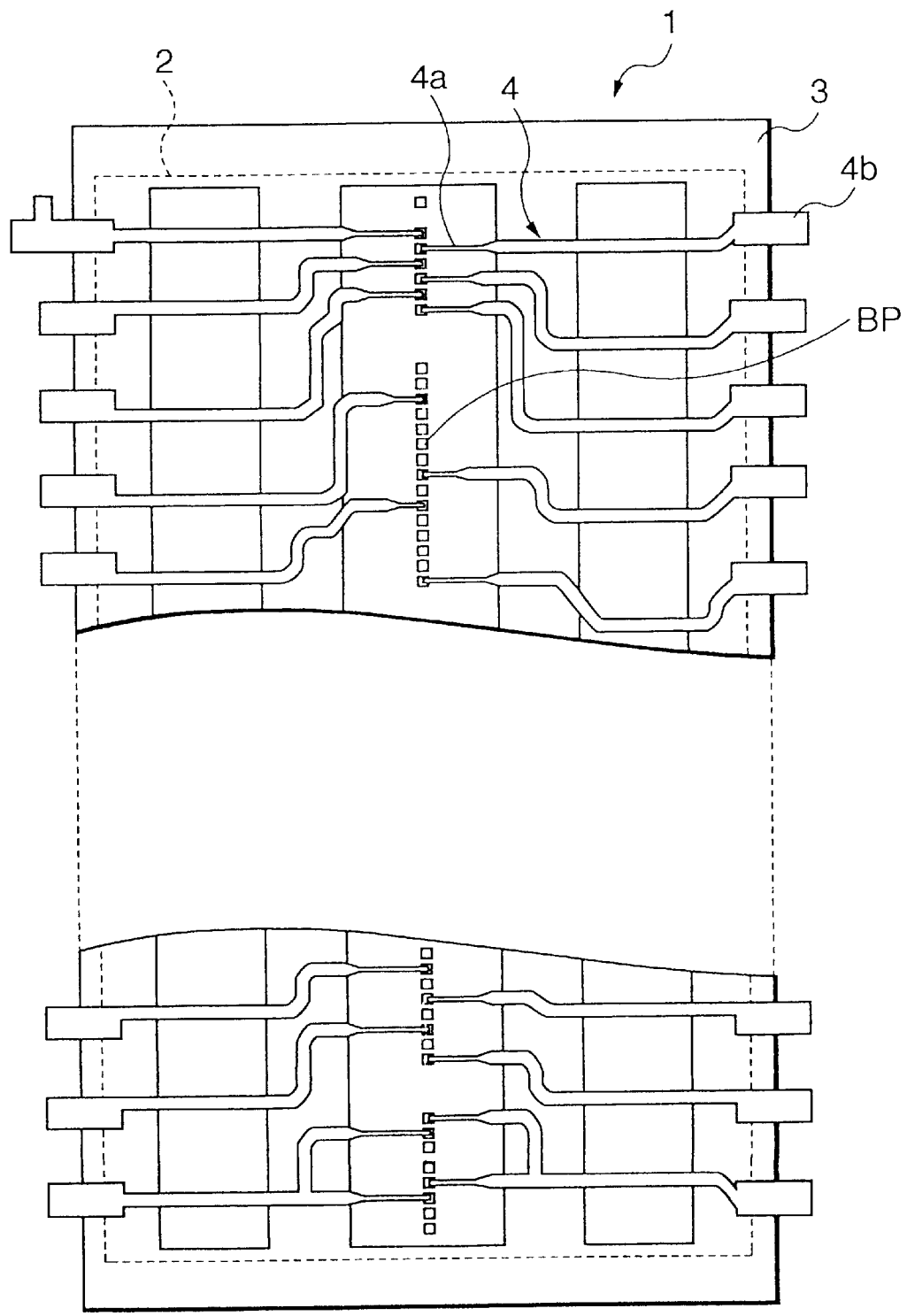
FIG. 1 is a diagrammatic top plan view of an essential portion of a memory according to Mode 1 of an Embodiment of the present invention.
Figure 2:
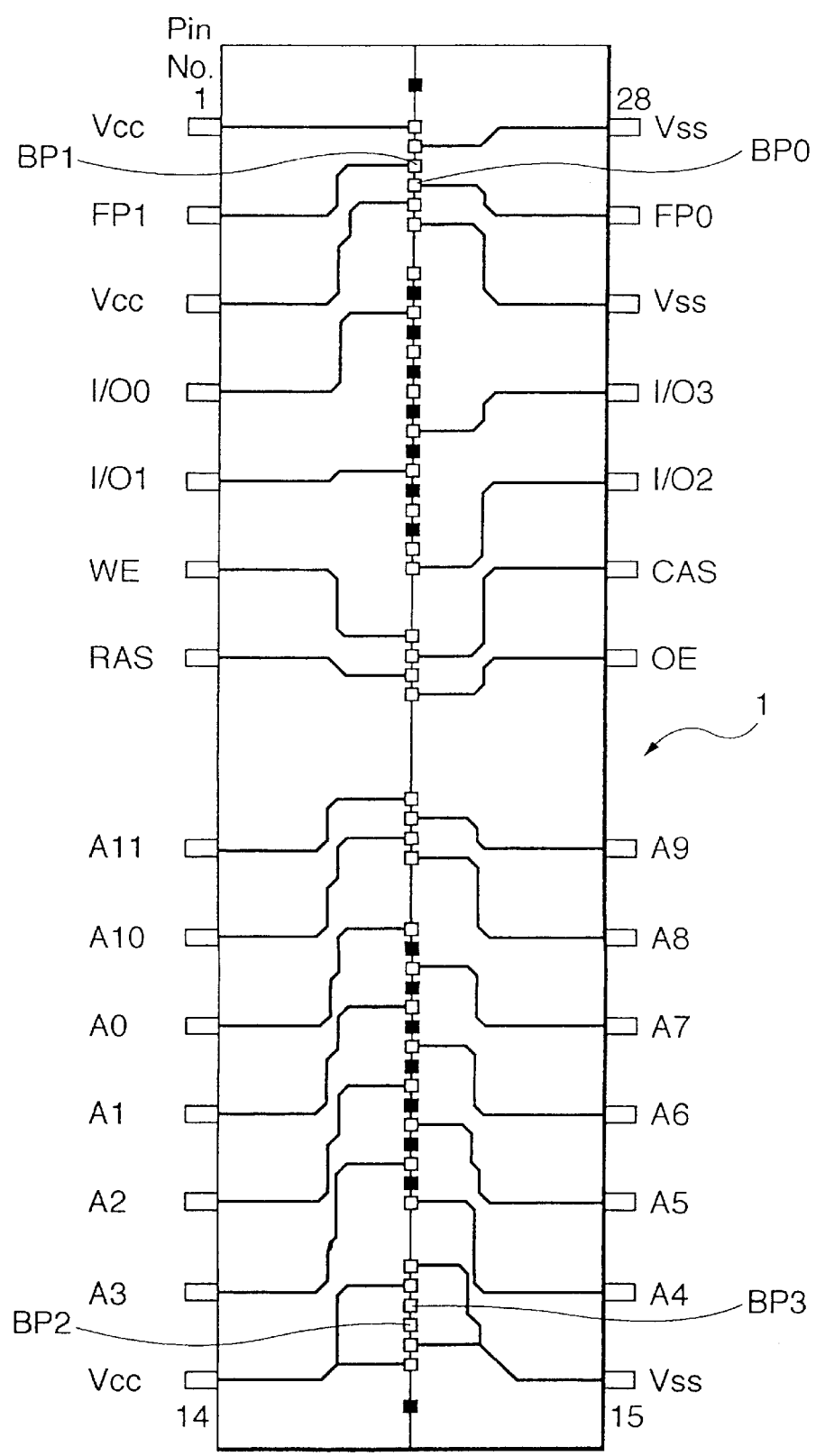
FIG. 2 is a pin arrangement diagram of the memory according to Mode 1 of an Embodiment of the present invention.

Next, the memory 1 is constructed to include twenty eight pins in total, as shown in FIG. 2. Of these, the 2nd and 27th pins, connected with bonding pads BP1 and BP0 for switching the functions, have outer leads acting as function switching pins (or function switching external terminals) FP1 and FP0.

On the other hand, the memory 1 is equipped with bonding pads BP3 and BP2 for switching the word structure so that the word structure is arbitrarily switched depending upon the states of signals to be inputted to the bonding pads BP3 and BP2.

In FIG. 2, moreover, there are provided data input/output pins IO0 to IO3, a pin WE for designating whether the access is to read or write, address input pins AO to A11, pins RAS and CAS for row and column selecting signals, a pin OE for a signal to control the states of a data output signal and a data input/output signal at a reading time, a pin Vcc for a supply voltage Vcc, and a pin Vss for a ground potential (or earth potential) or the reference potential.

Next, the internal connection structure in the memory 1 will be specifically described with reference to FIG. 3.

First of all, the memory 1 is shown to have the arrangement of only: the function switching bonding pads BP1 and BP0 or the electrodes, as electrically connected with the function switching pins FP1 and FP0 of the 2nd and 27th pins, and the bonding pads BP3 and BP2 for switching the word structure, of the bonding pads BP formed on the semiconductor chip 2; and the wiring lines 4 for the supply voltage Vcc of the 1st and 14th pins, and the wiring lines 4 for the ground potential of the 15th and 28th pins.

Here in the memory 1, the function means the reading mode which is constructed to include a refresh cycle or the cycle for a refreshing operation, and FAST PAGE and EDO.

As shown in FIG. 4, moreover, the memory 1 can switch the refresh cycle, the reading modes of FAST PAGE AND EDO, and three kinds of word structures of 4 M×1 bit, 1 M×4 bits and 512 K×8 bits.

Figure 3:
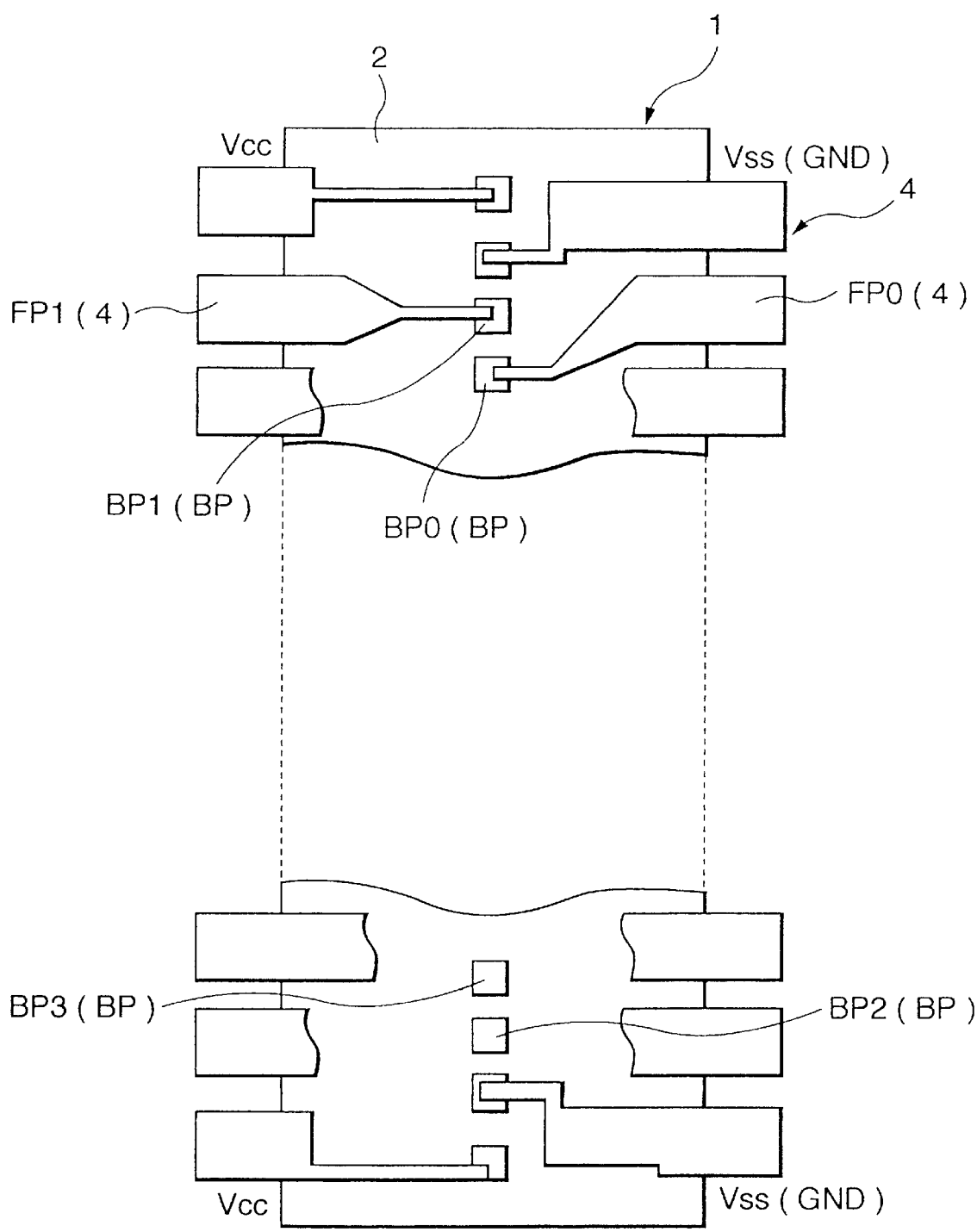
FIG. 3 is a diagrammatic top plan view showing internal connections of the memory according to Mode 1 of an Embodiment of the present invention.

On the other hand, these function switching operations in the memory 1 are executed by inputting the supply voltage Vcc, the ground potential Vss or the function switching signal, as selected from the no connections, to the connection destinations of the function switching bonding pads BP1 and BP0, arranged in the predetermined positions of the semiconductor chip 2 shown in FIG. 3, that is, the pins FP0 and FP1 for switching the functions of the 2nd and 27th pins, and by combining those function switching signals in the aforementioned manner, as shown in FIG. 4.

Moreover, the connection destinations of the word structure switching bonding pads BP3 and BP2 are predetermined by the wiring lines 4a, formed on the tape carriers. In the memory 1 of the present Mode of Embodiment, as shown in FIG. 2, the bonding pads BP3 and BP2 have no connection.

In the word structure of the memory 1, therefore, the bonding pads BP3 and BP2 have no connection (as indicated by 'OPEN' in FIG. 4), as shown in FIG. 4, so that the word structure of 4 K×4 bits is automatically selected.

On the other hand, if the function switching signal to be inputted to the function switching pin FP0 is OPEN (in FIG. 4) and if the function switching signal to be inputted to the function switching pin FP1 is exemplified by the supply voltage Vcc, the memory 1 is selected for the function in which the refresh cycle is 2 K and in which the reading mode is FAST PAGE.

Figure 5:
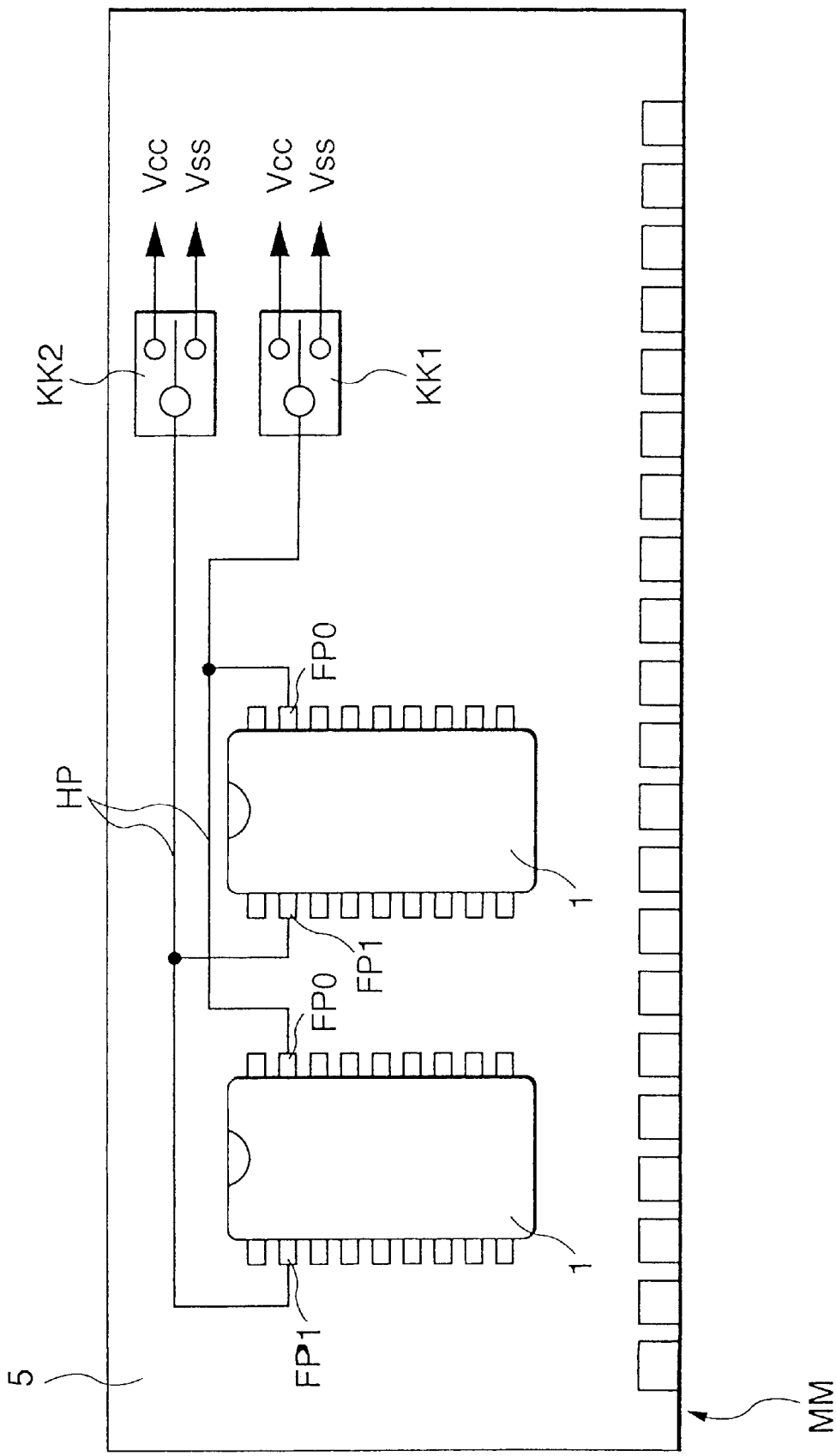
FIG. 5 is a connection diagram of one embodiment of a memory module, in which are mounted the memories according to the present invention.

With reference to FIG. 5, a method of switching the function of the memory 1 and the word structure will be described. Moreover, FIG. 5 does not explain the actual mounting arrangement, but schematically shows the connection state of the memory 1 in a memory module MM.

First of all, in the memory module MM of FIG. 5, a module wiring substrate (or printed-wiring substrate) 5 for mounting the memory 1 is equipped with function switching means KK1 for arbitrarily switching the function switching signal to be inputted to the function switching pin FP0 of the memory 1, and function switching means KK2 for arbitrarily switching the function switching signal to be inputted to the function switching pin FP1 of the memory 1.

On the other hand, the function switching signal is selected from any of the no connection, the supply voltage Vcc and the ground potential Vss. Moreover, the function switching pins FP0 and FP1 of all the memories 1, as mounted on the module wiring substrate 5, are so wired by a wiring pattern HP that they are connected with the function switching means KK1 and KK2, respectively.

By these function switching means KK1 and Kk2, moreover, the aforementioned function switching signals can be arbitrarily switched and inputted as a whole to all the mounted memories 1 so that the functions, constructed to include the reading mode and the refresh cycle, as shown in FIG. 4, can be switched and arbitrarily set.

Figure 6:
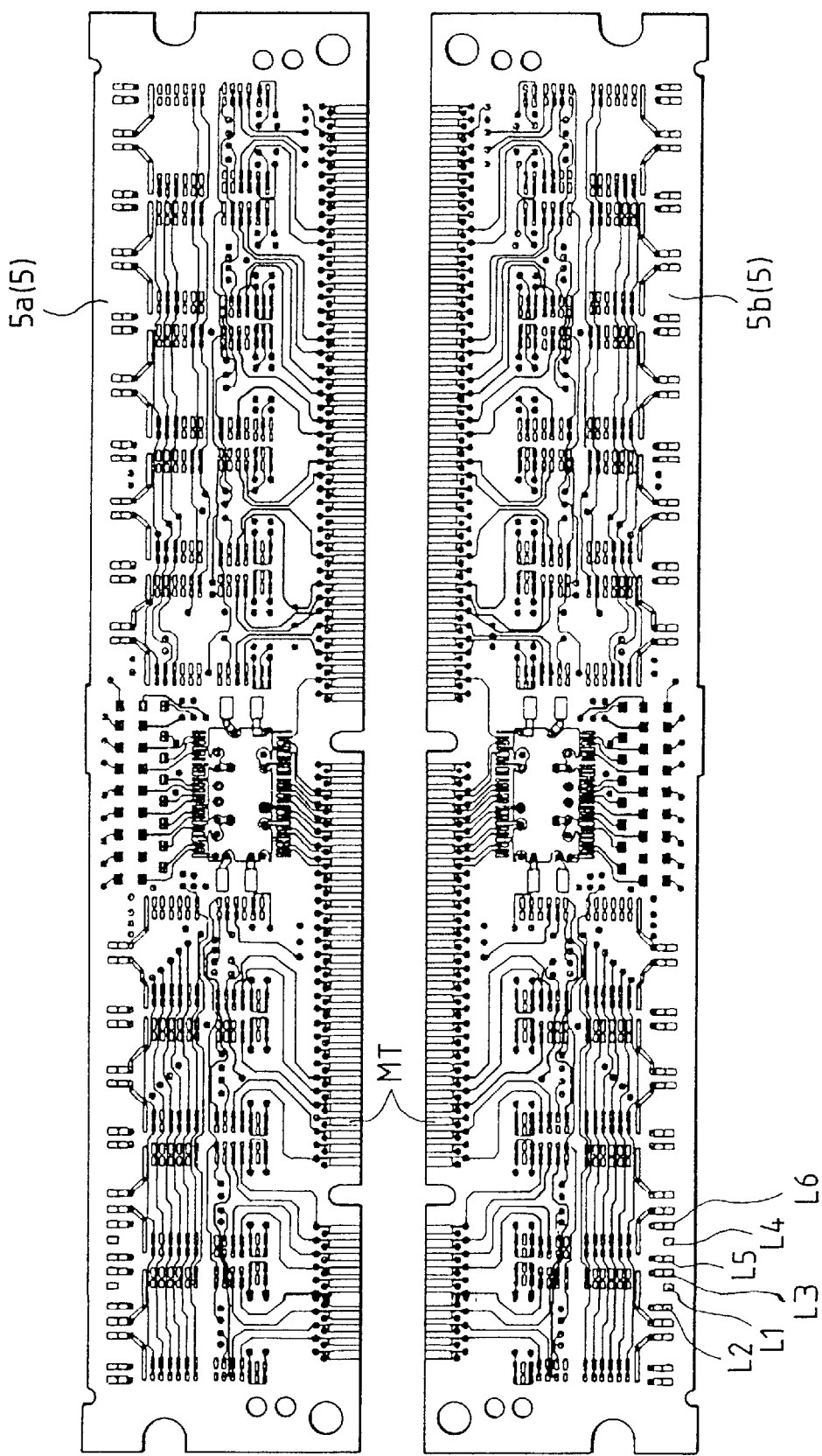
FIG. 6 is a wiring diagram showing a module wiring substrate in which is mounted the memory according to Mode 1 of an Embodiment of the present invention.
Figure 7:
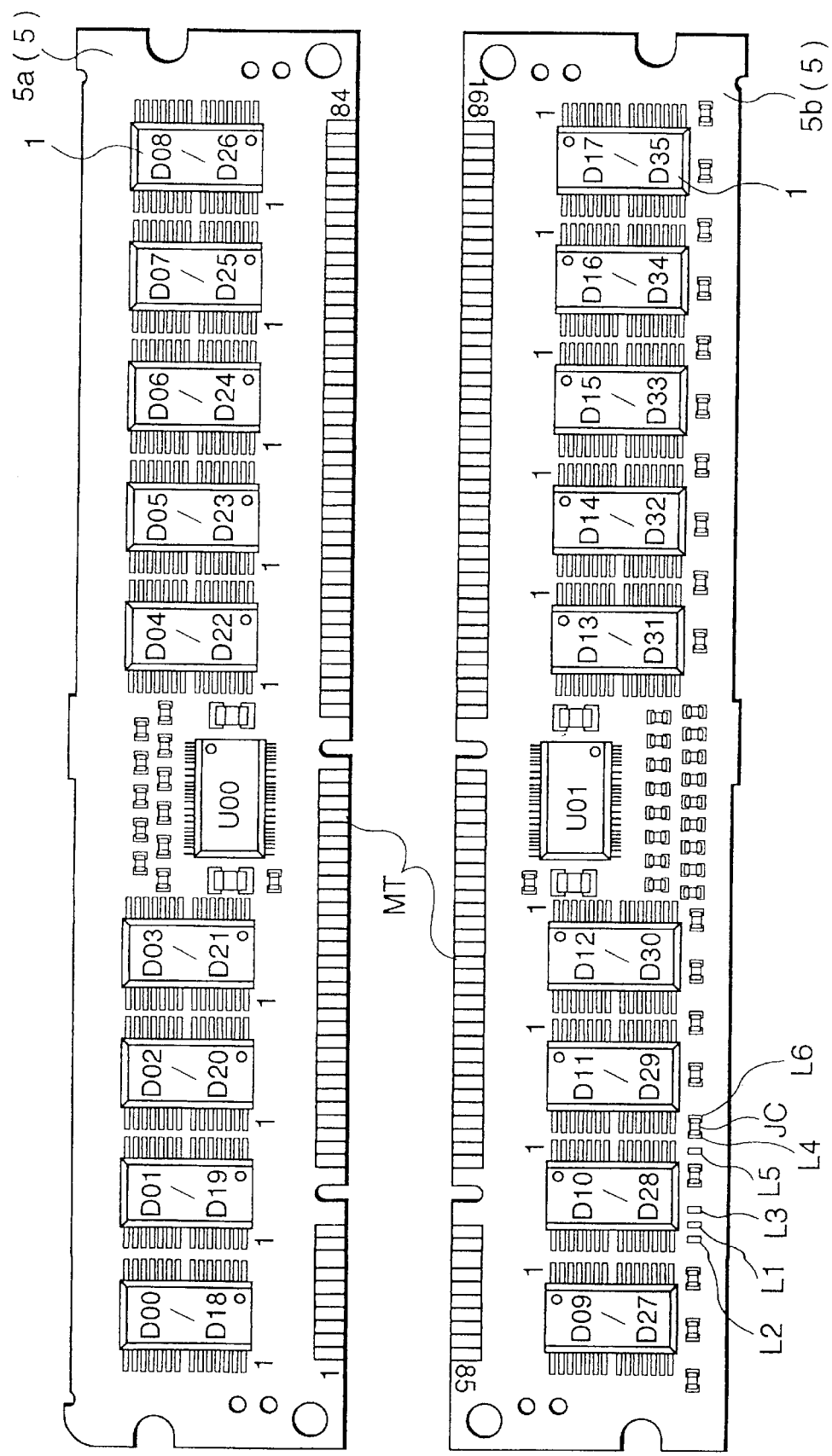
FIG. 7 is a mounting diagram of the module wiring substrate in which is mounted the memory according to Mode 1 of an Embodiment of the present invention.

With reference to FIGS. 6 and 7, there will be specifically described the memory module which is actually provided with the aforementioned function switching means KK1 and KK2 for switching the functions.

First of all, the memory module is constructed by mounting the TCP type memories 1 (as shown in FIG. 2) or a surface mounting package to make a predetermined memory structure. In this memory module, the module wiring substrate 5 for mounting the memories 1 has a front surface 5a and a back surface 5b, on which a predetermined number of memories 1 are mounted in the longitudinal direction of the module wiring substrate 5. The memories 1, mounted on the surfaces 5a and 5b of the module wiring substrate 5, are stacked in two stages to make a stacked structure.

On the surfaces 5a and 5b of the module wiring substrate 5, moreover, there are formed lands which are electrically connected with predetermined destinations so that the memories 1 and the various chip parts necessary for the memory module may be mounted.

In the vicinity of the corner portion of one longer side of the back surface 5b of the module wiring substrate 5, on the other hand, there are provided: a land (or a first node) L1 for mounting a later-described conducting chip for switching the state of the function switching signal to the function switching pin FP0 (as shown in FIG. 2), as disposed in the memory 1, a land (or a second node) L2, a land (or a third node) L3, a land (or a first node) L4 for mounting a conducting chip for switching the state of the function switching signal to the function switching pin FP1 (as shown in FIG. 2), a land (or a second node) L5, and a land (or a third node) L6.

At the other longer side of the surfaces 5a and 5b of the module wiring substrate 5, moreover, there are provided a predetermined number of module I/O terminals MT which are arranged in the longitudinal direction of the module wiring substrate 5.

On the surfaces 5a and 5b of the module wiring substrate 5, moreover, there are formed wiring patterns, by which the individual lands and module I/O terminals MT are individually electrically connected with the predetermined connection destinations.

The land L1 is electrically connected by a predetermined wiring pattern with the land, at which are overlapped the function switching pins FP0 of all the mounted memories 1, and the land L2 is electrically connected through the wiring pattern with the supply voltage Vcc, whereas the land L3 is electrically connected through the wiring pattern with the ground potential Vss.

The later-described conducting chip is mounted or not between the land L1 and the land L2 or between the land L1 and the land L3 so that it may be inputted as the function switching signal to the memory 1 to effect the function switching operations selectively all at once.

The function switching means KK1 is constructed to include those lands L1 to L3 and the conducting chips.

The land L4 of the module wiring substrate 5 is electrically connected by a predetermined wiring pattern with the land, at which are overlapped the function switching pins FP1 of all the memories 1 to be mounted, and the land L5 is electrically connected with the supply voltage Vcc through the wiring pattern, whereas the land L6 is electrically connected with the ground potential Vss through the wiring pattern.

The later-described conducting chip is mounted or not between the land L4 and the land L5 or between the land L4 and the land L6 so that it may be inputted as a function switching signal to the memory 1 to effect the function switching operations selectively all at once.

The function switching means KK2 is constructed to include those lands L4 to L6 and the conducting chips.

The lands L1 to L3 and L4 to L6 of the module wiring substrate 5 for mounting the conducting chips are formed in the vicinity of the corner portion of one longer side, where the module I/O terminals MT are not disposed, so that the conducting chips can be easily mounted/demounted even for the memory module MM which is sealed by the metal case.

By mounting the memories 1 and the chip parts in the module wiring substrate 5, as shown in FIG. 7, moreover, there is constructed a memory module MM called an 8-byte DIMM (dual inline memory module).

Here in FIG. 7, the memories 1 are switched such that the word structure is set in advance to 4 M×4 bits and such that the switching of the functions is so selected by the function switching signal inputted to the function switching pins FP0 and FP1 as to set the refresh cycle to 2 K cycle and the reading mode to FAST PAGE.

When the refresh cycle is set to 2 K cycle and the reading mode is set to FAST PAGE, as described above, it is found from FIG. 4 that the function switching signal to be inputted to the function switching pin FP0 may be non-connected whereas the function switching signal to be inputted to the function switching pin FP1 may be selected to the supply voltage Vcc.

As a result, the function switching pin FP0 is open so that the conducting chips or the chip parts such as jumpers or resistors are not mounted on the lands L1 to L3 to bring the function switching pins FP0 of all the memories 1, as mounted on the module wiring substrate 5, altogether into an open state.

Since the supply voltage Vcc is inputted to the function switching pin FP1, on the other hand, a conducting chip (or conducting means) JC or a chip part such as a jumper or resistor is mounted between the land L4 and the land L5, connected with the supply voltage Vcc, so that the supply voltage Vcc is inputted to the function switching pins FP1 of all the memories 1 mounted on the module wiring substrate 5.

Figure 8:
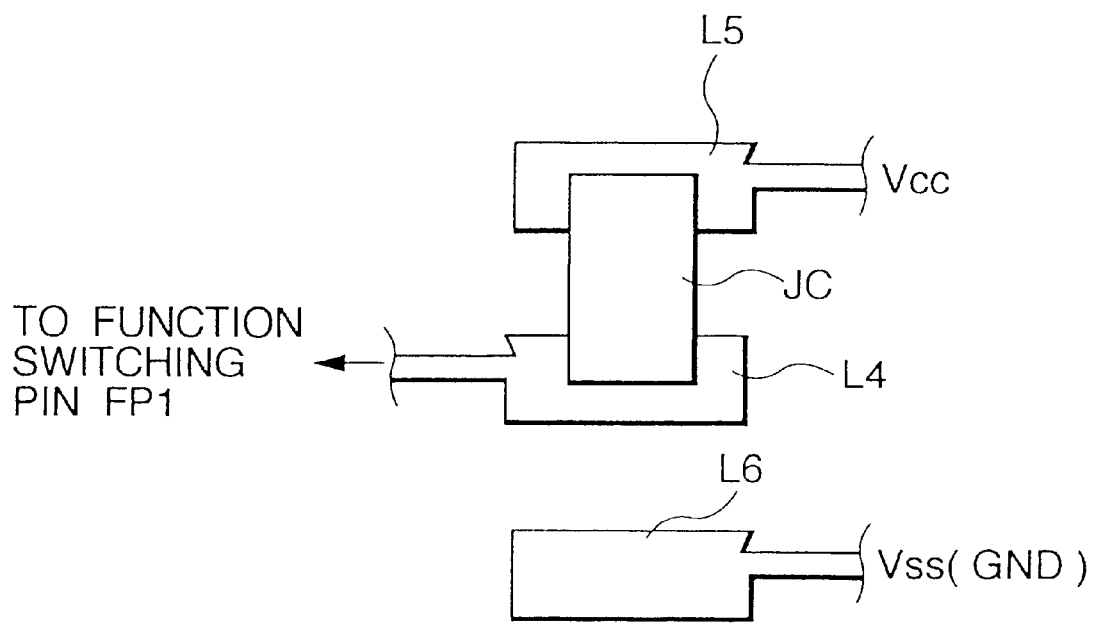
FIG. 8 is an explanatory diagram showing a mounting example of a jumper for switching the functions of the memory according to Mode 1 of an Embodiment of the present invention.

Thus, when the supply voltage Vcc is to be fed to the function switching pins FP1 of all the memories 1 (as shown in FIG. 2), as shown in FIG. 8, it is sufficient to mount the conducting chip JC between the land L4 and the land L5 of the module wiring substrate 5 (as shown in FIG. 6).

Figure 9:
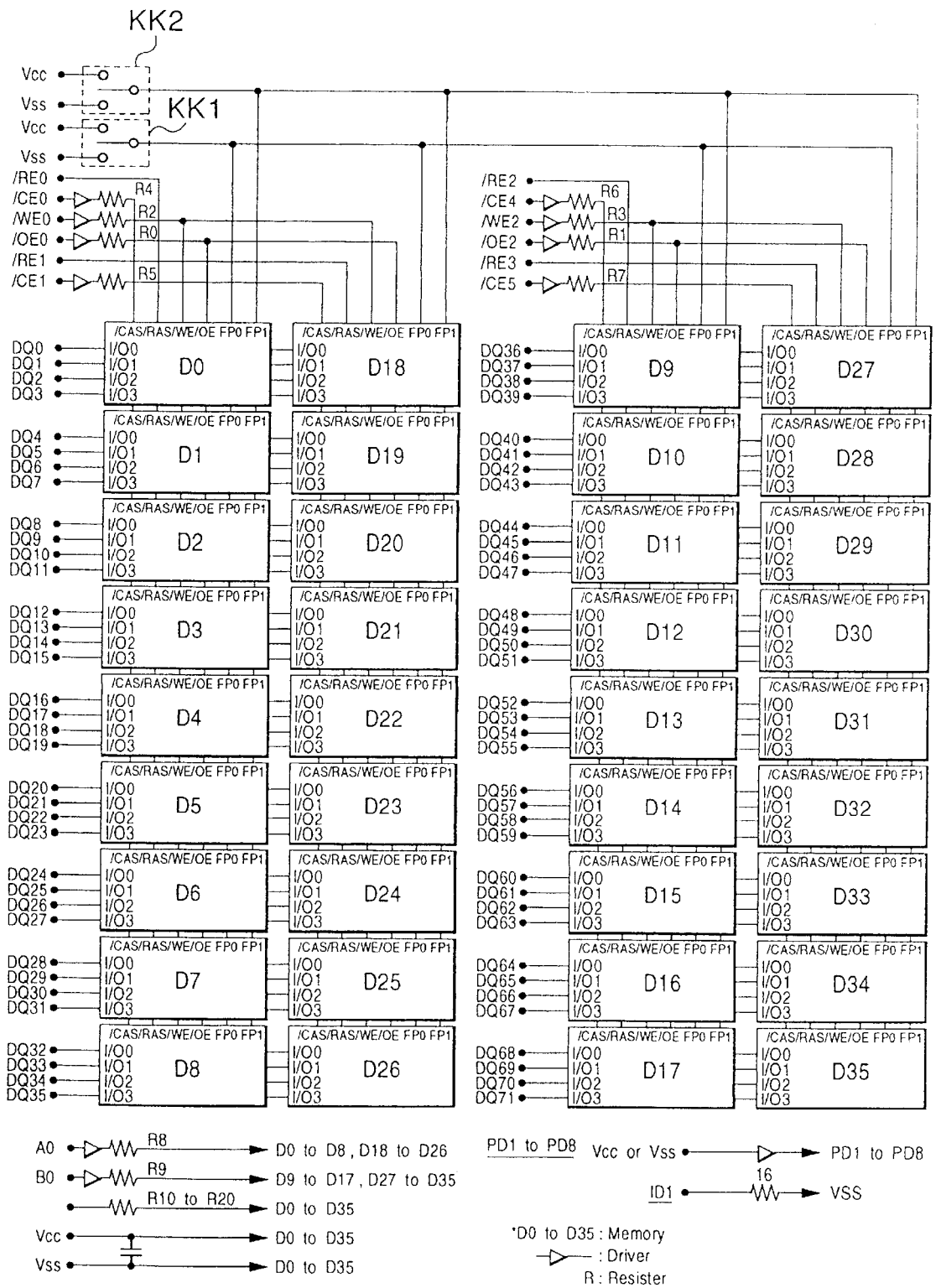
FIG. 9 is a block diagram showing the memory module according to Mode 1 of an Embodiment of the present invention.

Here, the connection state in this memory module MM is shown in the block diagram of FIG. 9. As shown in FIG. 9, the function switching signals to be inputted to the function switching pins FP1 and FP0 of all the memories 1 are selectively switched altogether by the function switching means KK1 and KK2.

Figure 10:
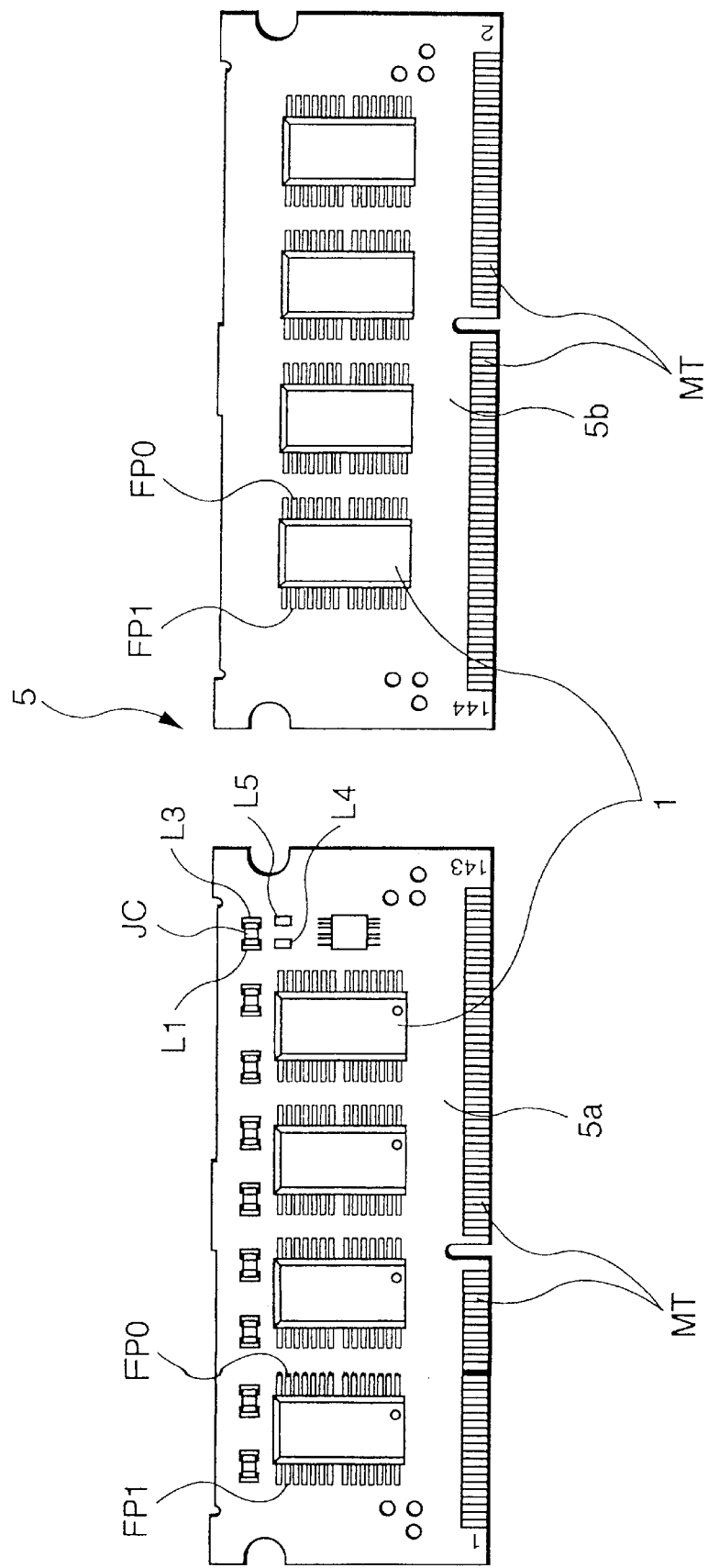
FIG. 10 is a mounting diagram showing the module mounting substrate in which is mounted a memory according to another mode of an embodiment of the present invention.
Figure 11A:
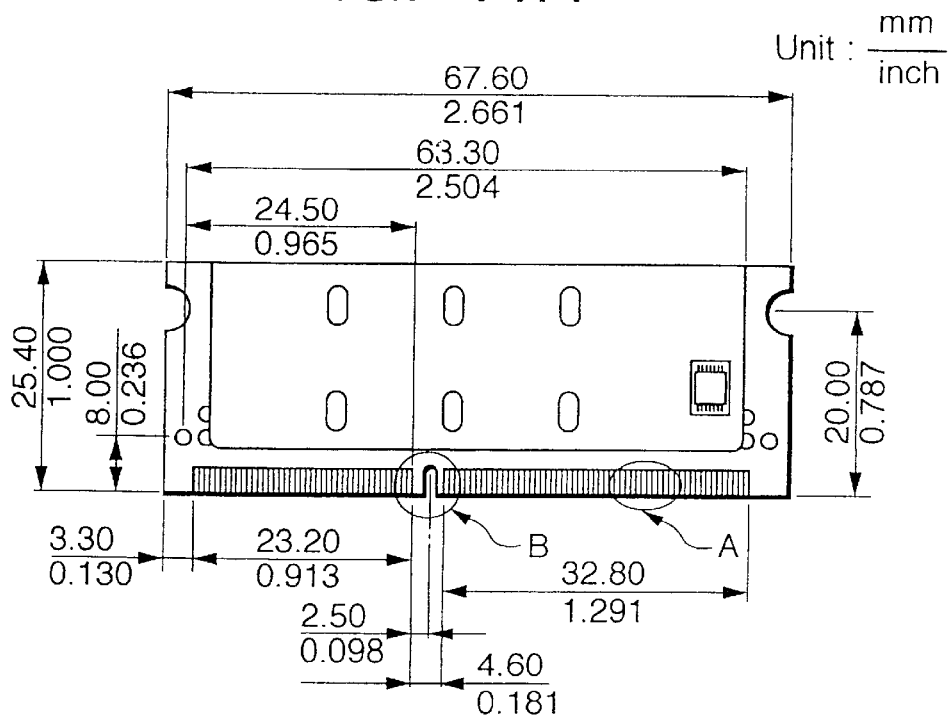
FIGS. 11A to 11D are standards diagrams of the module wiring substrate according to another mode of an embodiment of the present invention.
Figure 11B:
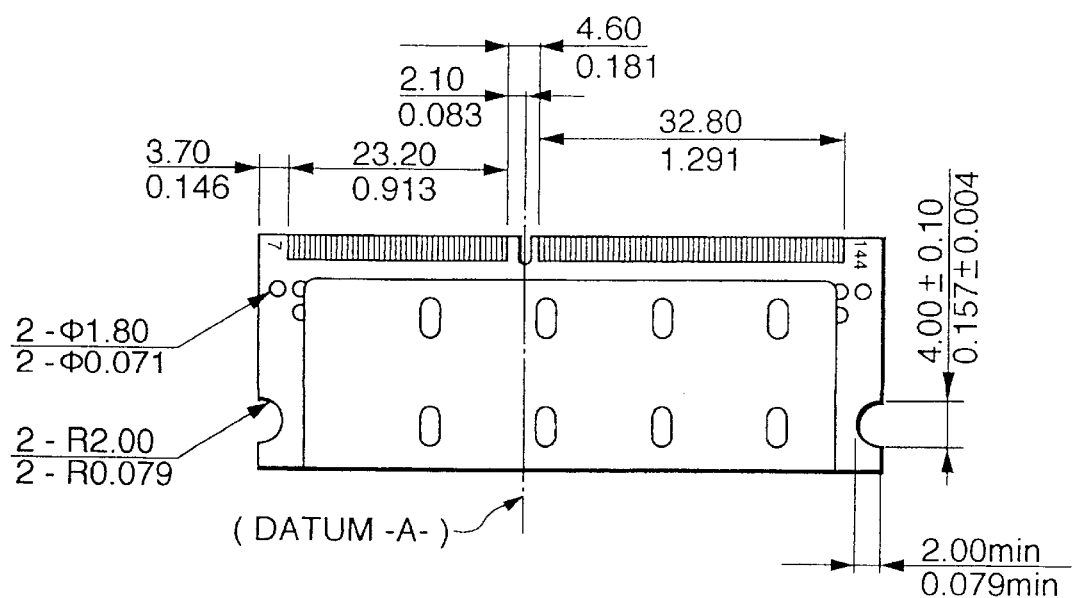
Figure 11C:
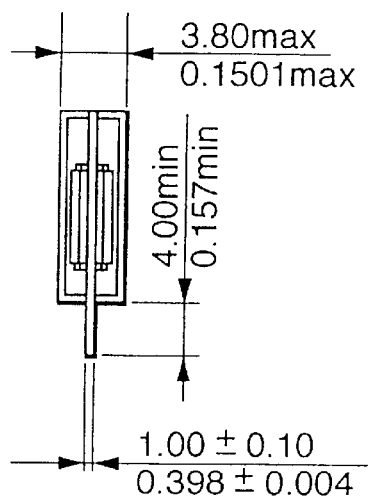
Figure 11D:
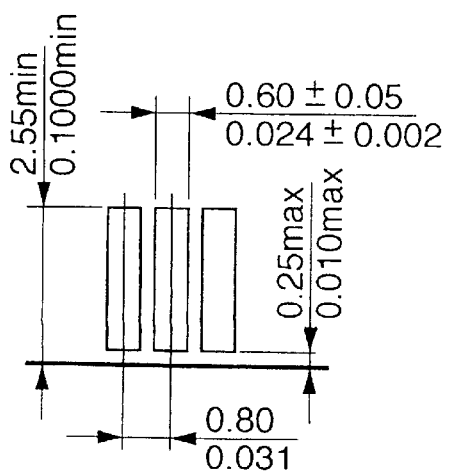
Figure 11E:
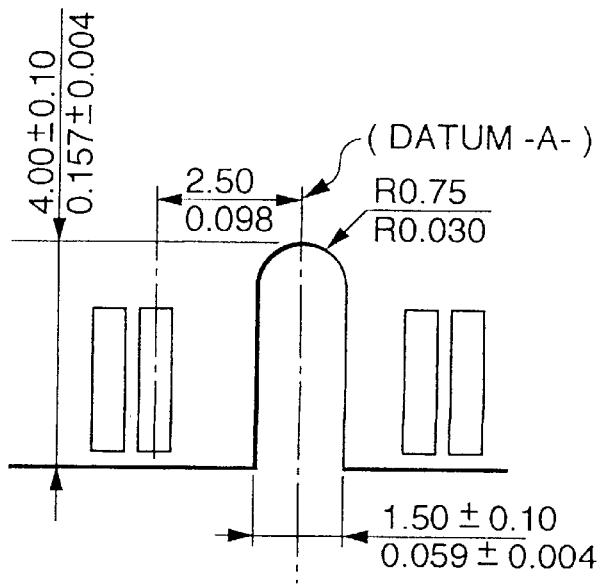

Next, there is shown in FIG. 10 an example of mounting the case in which the memory module MM is made of the SODIMM (small outlet dual inline memory module).

In this case, too, a predetermined number of TCP type memories 1 are mounted individually on the surfaces 5a and 5b of the module wiring substrate 5 to construct the predetermined memory structure so that the memories 1 make a stacked structure in which they are mounted in two stages.

In the vicinity of the corner portion of one longer side of the front surface 5a of the module wiring substrate 5, on the other hand, as in the aforementioned 8-byte DIMM memory module, there are disposed the lands L1, L3, L4 and L5 for mounting the later-described conducting chips for switching the states of the function switching signals to the function switching pins FP0 and FP1, as mounted in the memory 1.

Moreover, the land L1 is electrically connected by a predetermined wiring pattern with the land in which are overlapped the function switching pins FP0 of all the mounted memories 1, and the land L3 is electrically connected through the wiring pattern with the ground potential Vss.

On the other hand, the land L4 is electrically connected by a predetermined pattern with the land in which are overlapped the function switching pins FP1 of all the mounted memories 1, and the land L5 is electrically connected through a wiring pattern with the supply voltage Vcc.

Moreover, the conducting chip is mounted or not between the land L1 and the land L3 or between the land L4 and the land L5 so that the function switching signal is inputted to the memory 1 to effect the function switching operations selectively altogether.

Moreover, the lands L1 and L3 or the lands L4 and L5 of the module wiring substrate 5, for mounting the conducting chips or the chip parts, such as the jumpers or resistors, are formed in the vicinity of the corner portion of one longer side, where the module I/O terminals MT are not disposed, as shown in FIG. 10, and so the conducting chips can be easily mounted/demounted even from the memory module which is sealed by the metal case.

On the other hand, the module wiring substrate 5 to be used in the memory module made of the SODIMM is formed according to the standards as shown in FIGS. 11A, 11B, 11C, 11D and 11E.

Figure 12:
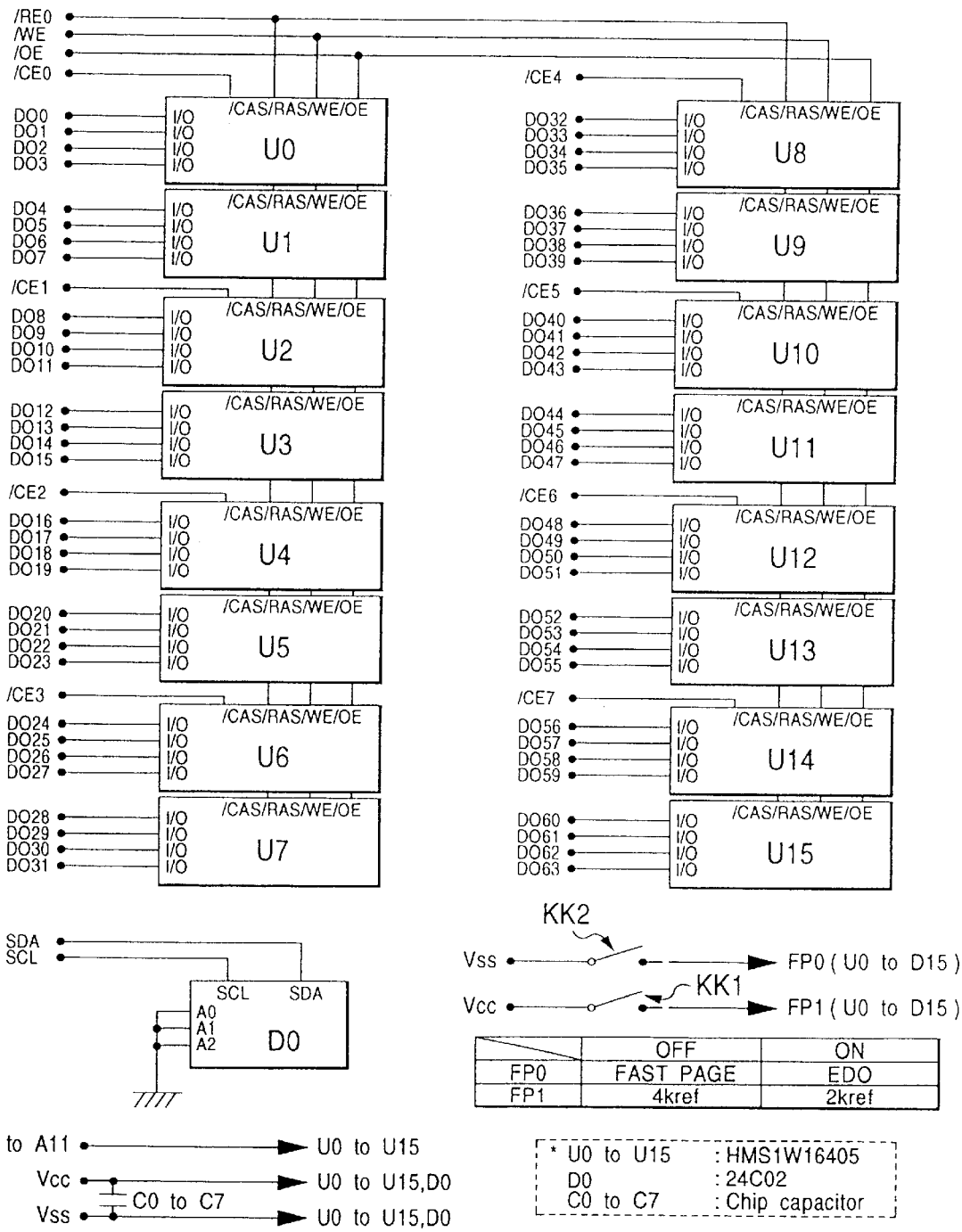
FIG. 12 is a block diagram showing the memory module according to another mode of an embodiment of the present invention.

Moreover, the connection state in the memory module MM is shown in a block diagram in FIG. 12.

As shown in FIG. 12, the function switching signals to be inputted to the function switching pins FP1 of all the memories 1 are selectively switched altogether to either the supply voltage Vcc or the non-connection by the function switching means KK1, and the function switching signals to be inputted to the function switching pins FP0 of all the memories 1 are selectively switched altogether to the ground potential Vss or no connection by the function switching means KK2.

As a result, when the input of the function switching pin FP0 is open (as indicated by 'OFF' in FIG. 12), the reading mode is the FAST PAGE. When the input of the function switching pin FP0 is at the ground potential Vss (as indicated by 'ON' in FIG. 12), the reading mode is the EDO mode.

On the other hand, when the input of the function switching pin FP1 is open, the refresh cycle is the 4 K cycle. When the input of the function switching pin FP1 is at the supply voltage Vcc (as indicated by 'ON' in FIG. 12), the refresh cycle is the 2 K cycle.

With the reading mode being the EDO mode and the refresh cycle being the 4 K cycle, for example, the input of the function switching pin FP0 is at the ground potential Vss, and the input of the function switching pin FP1 may be open. As shown in FIG. 10, therefore, the conducting chip JC may be mounted between the land L1 and the land L3, but may be omitted between the lands L4 and L5.

Here, the function switching signal is selectively switched to either the supply voltage Vcc or no connection, or the ground potential Vss or no connection by the function switching means KK1 and KK2. However, these function switching means KK1 and KK2 are made to select the supply voltage Vcc, the ground potential Vss or no connection so that those function switching signals can be combined to switch the functions in the memory 1.

As a result, the following effects can be achieved according the present Mode 1 of an Embodiment.

(1) The functions of all the mounted memories 1 can be switched and set altogether by the function switching means KK1 and KK2 so that the functions of the memory module MM can be easily switched for a short time period.

(2) The assembly specifications of the memory module MM can be made common to improve the developing efficiency of products and facilitate the product management.

(3) By providing the function switching means KK1 and KK2 at the corner portion or in its vicinity of the module wiring substrate 5, the functions of the memories 1 even in the memory module, as completed as a product, can be easily switched for a short time period to improve the degree of freedom for the productivity drastically.

Figure 13:
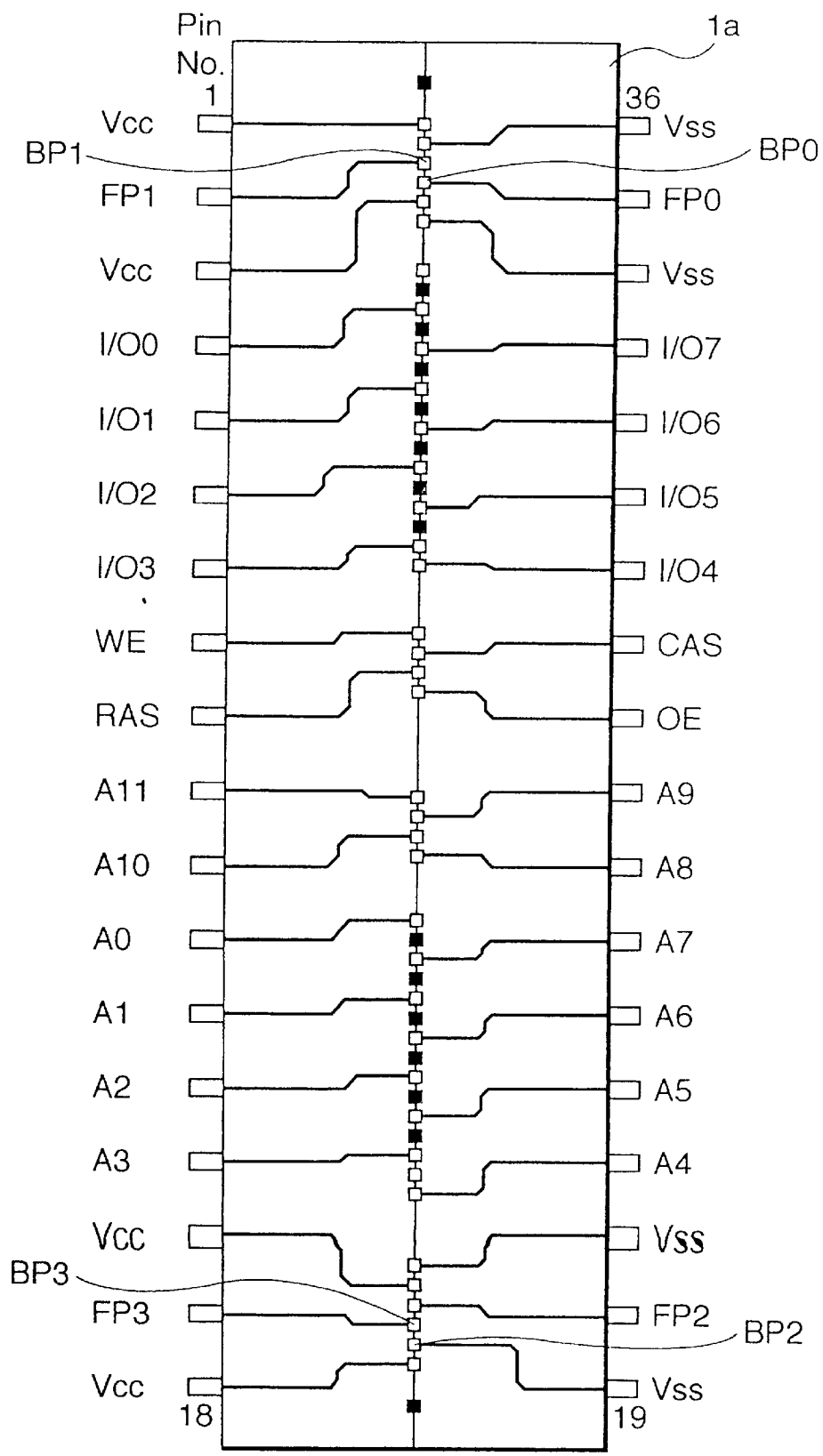
FIG. 13 is a pin arrangement diagram of a memory according to Mode 2 of an Embodiment of the present invention.
Figure 14:
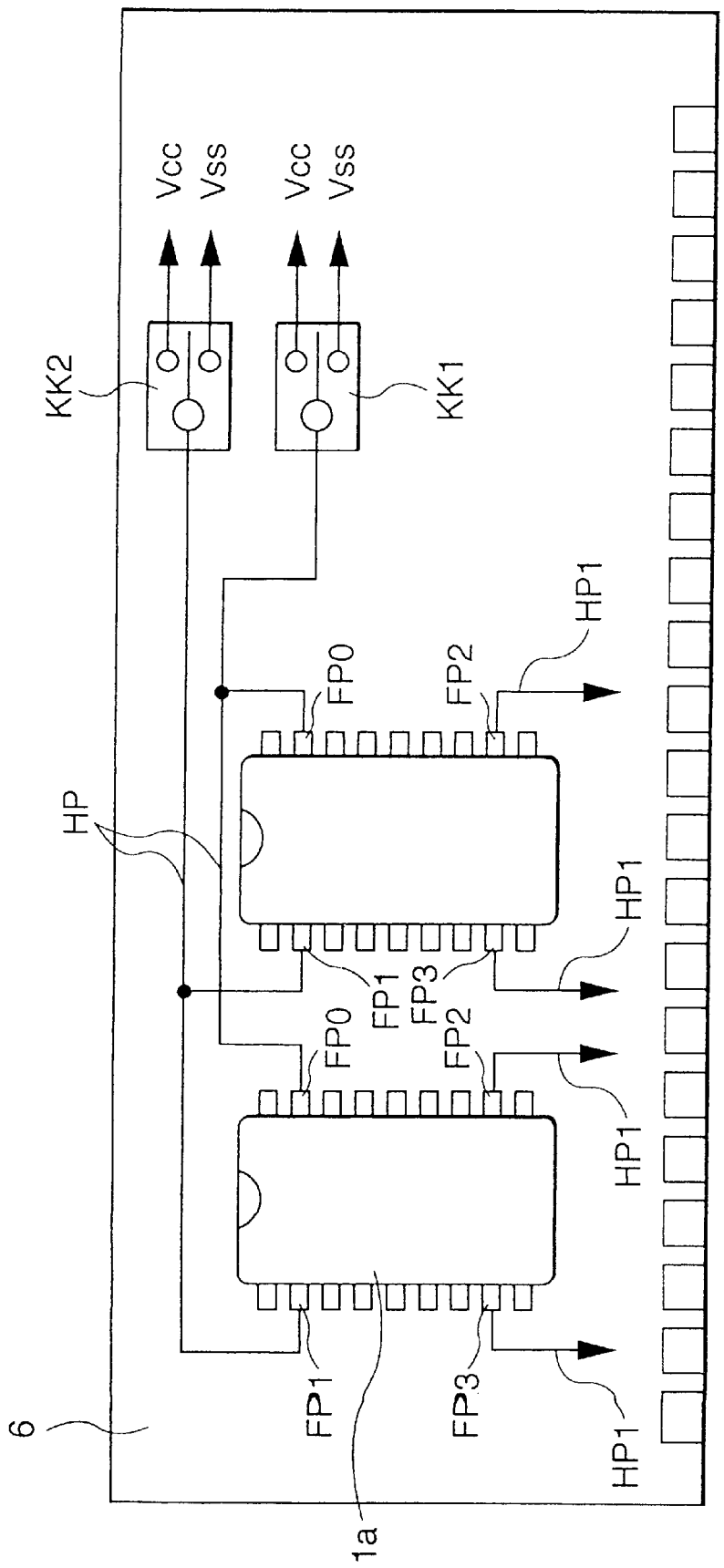
FIG. 14 is a connection diagram of another embodiment of the memory module in which are mounted memories according to the present invention.
Figure 15:
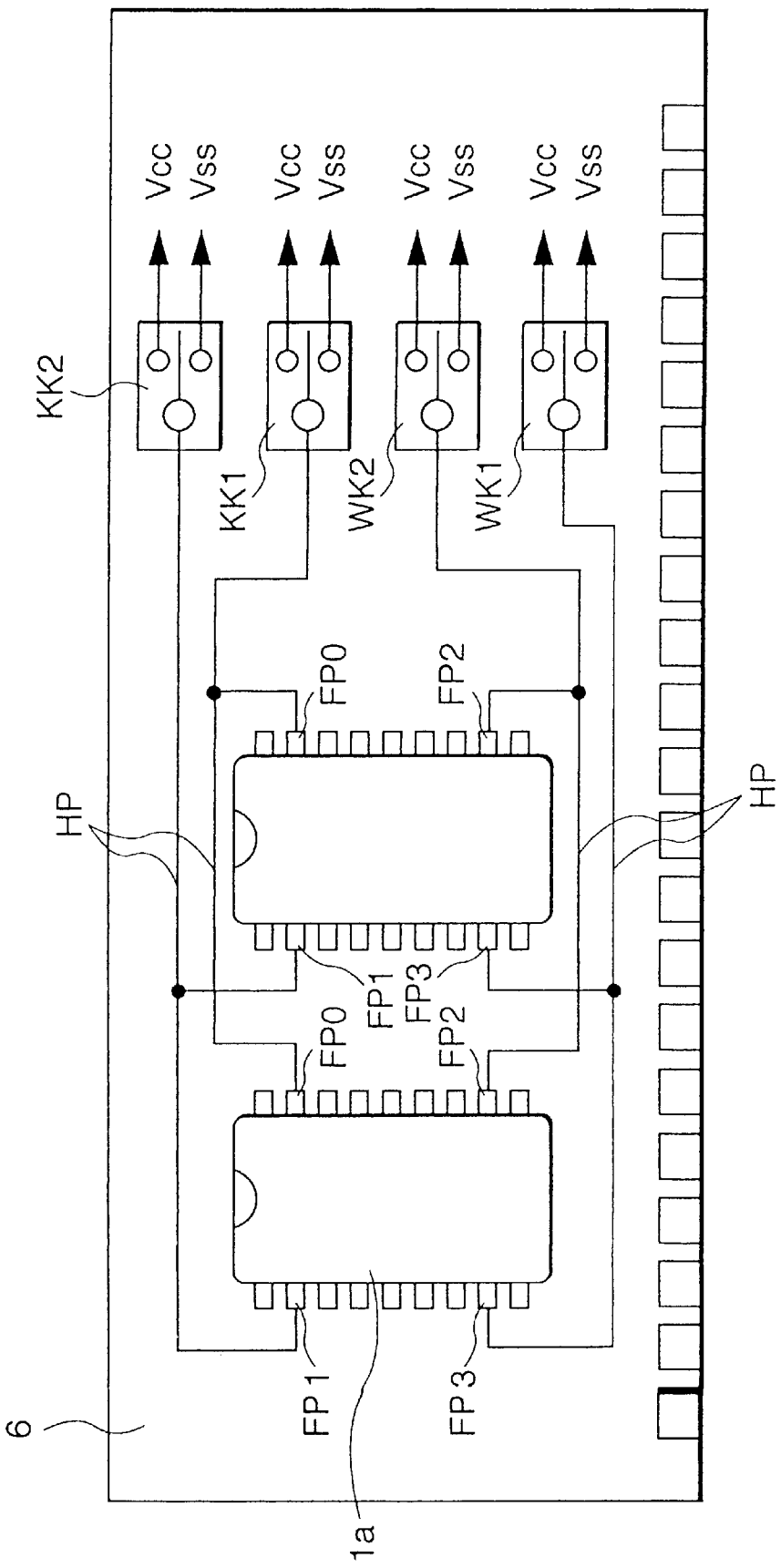
FIG. 15 is a connection diagram of another embodiment of the memory module in which are mounted memories according to the present invention.
Figure 16:
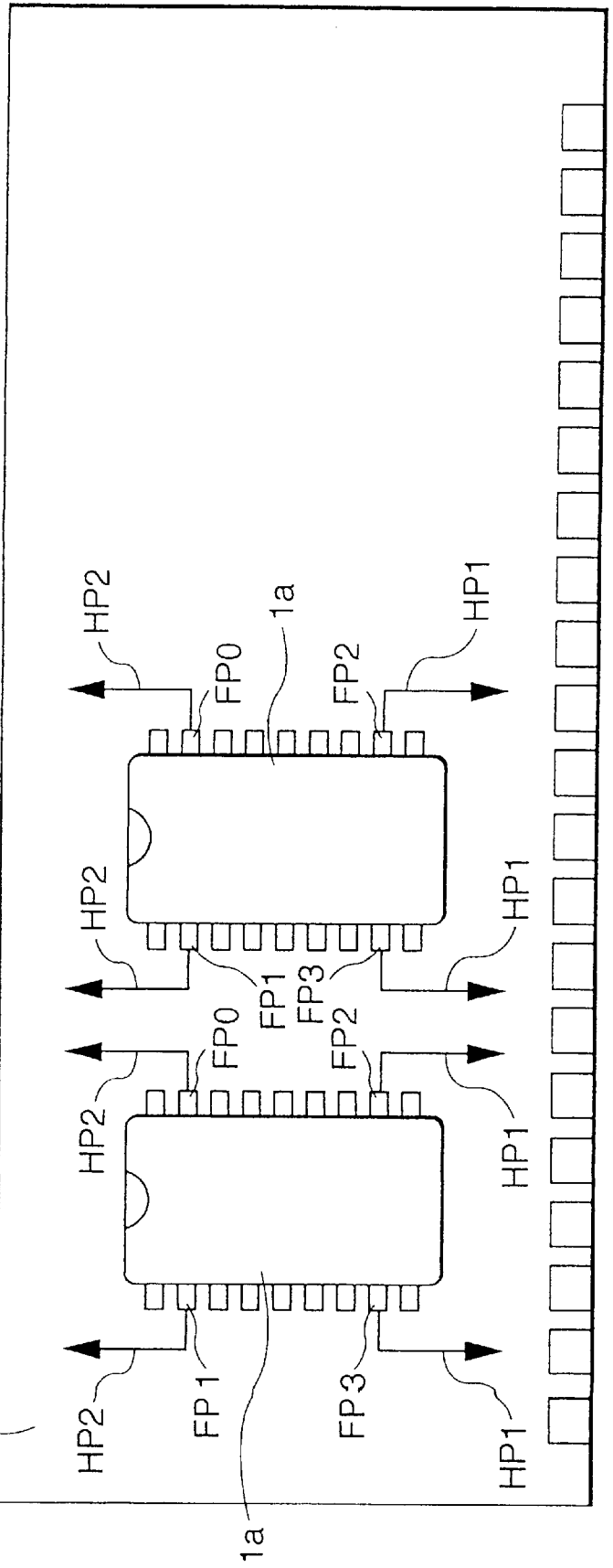
FIG. 16 is a connection diagram of another embodiment of the memory module in which are mounted memories according to the present invention.

FIG. 13 is a pin arrangement diagram of a memory according to Mode 2 of an Embodiment of the present invention, and FIGS. 14, 15 and 16 are explanatory diagrams showing the memory module in which are mounted the memories according to the present invention.

In the present Mode 2 of an Embodiment, a memory 1a is made of a TCP type DRAM semiconductor device or a kind of surface mounting package. As shown in FIG. 13, the memory 1a is constructed to include a total of 36 pins. Of these, the 2nd and 35th pins, as connected with the function switching bonding pads BP1 and BP0, are provided with outer leads as the function switching pins FP1 and FP0 so that an arbitrary function is switched depending upon the state of the function switching signal inputted.

On the other hand, the memory 1a is equipped as word structure switching pins (or word structure switching external terminals) FP3 and FP2 with the outer leads of the 17th and 20th pins, connected with the bonding pads BP3 and BP2 for switching the word structure, so that an arbitrary word structure is switched depending upon the state of the word structure switching signal to be inputted to the pins FP3 and FP2.

Moreover, there are provided data input/output pins IO0 to IO7, a pin WE for designating whether the access is to read or write, address input pins A0 to A11, pins RAS and CAS for row and column selecting signals, a pin OE for a signal to control the states of a data output signal and a data input/output signal at a reading time, a pin Vcc for the supply voltage Vcc, and a pin Vss for a ground potential or the reference potential.

The internal connection structure in the memory 1a is specifically described below.

First of all, as shown in FIG. 4, for example, the memory 1a can arbitrarily switch the functions to switch the refresh cycle or the cycle of the refreshing operation and the reading mode of FAST PAGE and EDO, on the basis of the function switching signals to be inputted to the function switching pins FP1 and FP0, and can switch three kinds of word structures of 4 M×1 bit, 1 M×4 bits and 512 K×8 bits on the basis of the word structure switching signals to be inputted to the word structure switching pins FP3 and FP2.

The functions of the memory 1a are switched by inputting signals selected from the function switching signals, such as the supply voltage Vcc, the ground potential Vss or no connection, to the pins FP1 and FP0 for switching the functions of the 2nd and 35th pins, as shown in FIG. 13, and by combining those signals, as shown in FIG. 4.

The word structure of the memory 1a is likewise switched by inputting signals selected from the word structure switching signals, such as the supply voltage Vcc, the ground potential Vss or no connection, to the word structure switching pins FP3 and FP2 of the 17th and 20th pins for switching the word structure, and by combining those signals, as shown in FIG. 4.

With reference to FIGS. 14, 15, 16 and 17, there will be described the method of switching the functions and the word structure of the memory 1a. On the other hand, FIGS. 14, 15, 16 and 17 show not the actual mounting structure, but schematically show the connection state of the memories 1a in the memory module.

First of all, as shown in FIG. 14, the substrate to be used for mounting the memories 1a is exemplified by a dedicated module wiring substrate (or a dedicated. printed-wiring substrate) 6 which is wired in advance to correspond to a predetermined word structure.

On the module wiring substrate 6, on the other hand, there are mounted the memories 1a which are equipped with the function switching pins FP1 and FP0 and the word structure switching pins FP3 and FP2.

On the module wiring substrate 6, moreover, there is wired a wiring pattern (or a word structure setting line) HP1 for inputting a predetermined word switching signal of no connection, the supply voltage Vcc or the ground potential Vss to the word structure switching pins FP3 and FP2 of the memories 1a so that a predetermined word structure may be set.

On the other hand, the module wiring substrate 6 is equipped with the function switching means KK1 for arbitrarily switching the function switching signal, as selected from no connection, the supply voltage Vcc or the ground potential Vss, to be inputted to the function switching pins FP0 of the memories 1a, and the function switching means KK2 for arbitrarily switching the function switching signal, as likewise selected from any of no connection, the supply voltage Vcc or the ground potential Vss to be inputted to the function switching pins FP1 of the memories 1a.

Moreover, The function switching pins FP0 and FP1 of all the memories 1a mounted on the module wiring substrate 6 are so wired by the wiring pattern HP that they may be connected with the function switching means KK1 and KK2, respectively As a result, the aforementioned function switching signals can be arbitrarily switched by those function switching means KK1 and KK2 to switch and set arbitrarily the functions including of the reading modes and the refresh cycles, as shown in FIG. 4.

As a result, the functions of the memories 1a can be arbitrarily switched and set by the function switching means KK1 and KK2 even before or after the memories 1a are mounted.

Next, in order that an arbitrary word structure may be set on the dedicated module wiring substrate 6 mounting the memories 1 thereon, as shown in FIG. 15, there are provided word structure switching means WK1 and WK2 for switching any of no connection, the supply voltage Vcc or the ground potential Vss arbitrarily as the word structure switching signal to the word structure switching pins FP3 and FP2 of the memories 1a.

On the module wiring substrate 6, on the other hand, there are likewise provided the function switching means KK1 and KK2 for switching the aforementioned function switching signal arbitrarily to the function switching pins FP0 and FP1 of the memories 1a.

Moreover, the function switching pins FP0 and FP1 of all the memories 1a, as mounted on the module wiring substrate 6, are so wired by the wiring pattern HP that they may be connected with the function switching means KK1 and KK2, respectively, and the word structure switching pins FP2 and FP3 of all the memories 1a are so wired by the wiring pattern HP that they may be connected with the word structure switching means WK1 and WK2, respectively.

As a result, the function switching signals are arbitrarily switched by those function switching means KK1 and Kk2 to arbitrarily switch and set the functions including the reading modes and the refresh cycles, as shown in FIG. 4.

The word structure switching signals are so switched by the word structure switching means WK1 and WK2 that the memories 1a may be switched and set to the word structure corresponding to the module wiring substrate 6.

As a result, the functions and the word structures of the memories 1a can be arbitrarily switched and set by the function switching means KK1 and KK2 and the word structure switching means WK1 and WK2 even before or after the memories 1a are mounted.

Only the word structure switching means for switching the word structures may be provided on the module wiring substrate, and the functions may be switched by wiring the wiring pattern, in which a predetermined function switching signal is inputted to the function switching pins of the memories, as mounted for the predetermined function to be switched and set, so that the functions may be arbitrarily set by switching the word structures.

In this case, too, the dedicated module wiring substrate, corresponding to the word structures and functions to be switched and set, is prepared to mount the memories thereon.

Next, on the dedicated module wiring substrate 6 having the memories 1a mounted thereon, as shown in FIG. 16, there are formed the wiring pattern HP1, which is so wired that the preset word structure switching signal may be inputted to the word structure switching pins FP3 and FP2, and a wiring pattern (or a function setting line) HP2 which is so wired that the preset function switching signal may be inputted to the function switching pins FP1 and FP0.

The functions and the word structures of the memories 1a are automatically switched and set by selecting the dedicated module wiring substrate 6, for which the predetermined function and word structure are switched and set in advance, and by mounting the memories 1a on the selected module wiring substrate 6.

The aforementioned function switching means KK1 is constructed to include conducting chips for selecting the state of the function switching signal to the function switching pin FP0 (as shown in FIG. 13), mounted on the memories 1a, and mounting lands for mounting the conducting chips.

These mounting lands include: function lands electrically connected by a predetermined wiring pattern with the lands, at which are overlapped the function switching pin FP0; power lands electrically connected through the wiring pattern with the supply voltage Vcc; and ground lands electrically connected through the wiring pattern with the ground potential Vss.

Likewise, the aforementioned function switching means KK2 is also constructed to include conducting chips for switching the state of the function switching signal to the function switching pin FP1 (as shown in FIG. 13), mounted on the memories 1a, and mounting lands for mounting the conducting chips. These mounting lands include: function lands electrically connected by a predetermined wiring pattern with the lands, at which are overlapped the function switching pin FP1; power lands electrically connected through the wiring pattern with the supply voltage Vcc; and ground lands electrically connected through the wiring pattern with the ground potential Vss.

With or without the conducting chips provided between the function lands and the power lands or between the function lands and the ground lands, any of the supply voltage Vcc, the ground potential Vss and no connection may be arbitrarily selected and inputted as the function switching signal to the memories 1a to effect the function switching operations selectively altogether.

Next, the aforementioned word structure switching means WK1 include conducting chips (or conducting means) for switching the state of the function switching signal to the word structure switching pins FP2 (as shown in FIG. 13), as mounted on the memories 1a, and mounting lands for mounting the conducting chips thereon.

These mounting lands include: word lands (or fourth nodes) electrically connected by a predetermined wiring pattern with the lands, at which are overlapped the word structure switching pins FP2; power lands (or fifth nodes) electrically connected through the wiring pattern with the supply voltage Vcc; and ground lands (or sixth nodes) electrically connected through the wiring pattern with the ground potential Vss.

The word structure switching means WK2 is constructed to include conducting chips for switching the state of the function switching signal to the word structure switching pins FP3 (as shown in FIG. 13), as mounted on the memories 1a, and mounting lands for mounting the conducting chips thereon.

These mounting lands include: word lands electrically connected by a predetermined wiring pattern with the lands, at which are overlapped the word structure switching pins FP3; power lands electrically connected through the wiring pattern with the supply voltage Vcc; and ground lands electrically connected through the wiring pattern with the ground potential Vss.

With or without the conducting chips provided between the word lands and the power lands or between the word lands and the ground lands, any of the supply voltage Vcc, the ground potential Vss and the non-connection may be arbitrarily selected and inputted as the function switching signal to the memories 1a to effect the word switching operations selectively altogether.

The mounting lands for mounting the aforementioned conducting chips are arranged in the vicinity of the corner portion of the module wiring substrate 6 so that they can be easily mounted/demounted even from the memory module which is shielded by the metal case.

As a result, the following effects can be achieved according the present Mode 2 of an Embodiment.

(1) The functions and word structures of all the mounted memories 1a can be switched altogether by the function switching means KK1 and KK2 and the word structure switching means WK1 and WK2 so that the functions of the memory module MM can be easily switched for a short time period.

(2) Thanks to the aforementioned effect (1), the specifications of the film to be used for the memories 1a can be made common to reduce the cost and improve the productivity.

(3) The assembly specifications of the memory module MM can be made common to improve the developing efficiency of products and facilitate the product management.

(4) By providing the function switching means KK1 and KK2 and the word structure switching means WK1 and WK2 at the corner portion or in its vicinity of the module wiring substrate 6, the functions of the memories 1a even in the memory module, completed as a product, can be easily switched for a short time period.

The present Mode 2 of an Embodiment has been described with reference to TCP type memories 1a. Despite this description, however, the memory module may be constructed by using either the memories having a BGA (ball grid array) structure, such as the CSP (chip size package) type made of a package having an external diameter substantially equal to that of the semiconductor chip, or the memories having a LOC (lead on chip) structure of the SOJ (small outline j-leaded Package) type.

Figure 17:
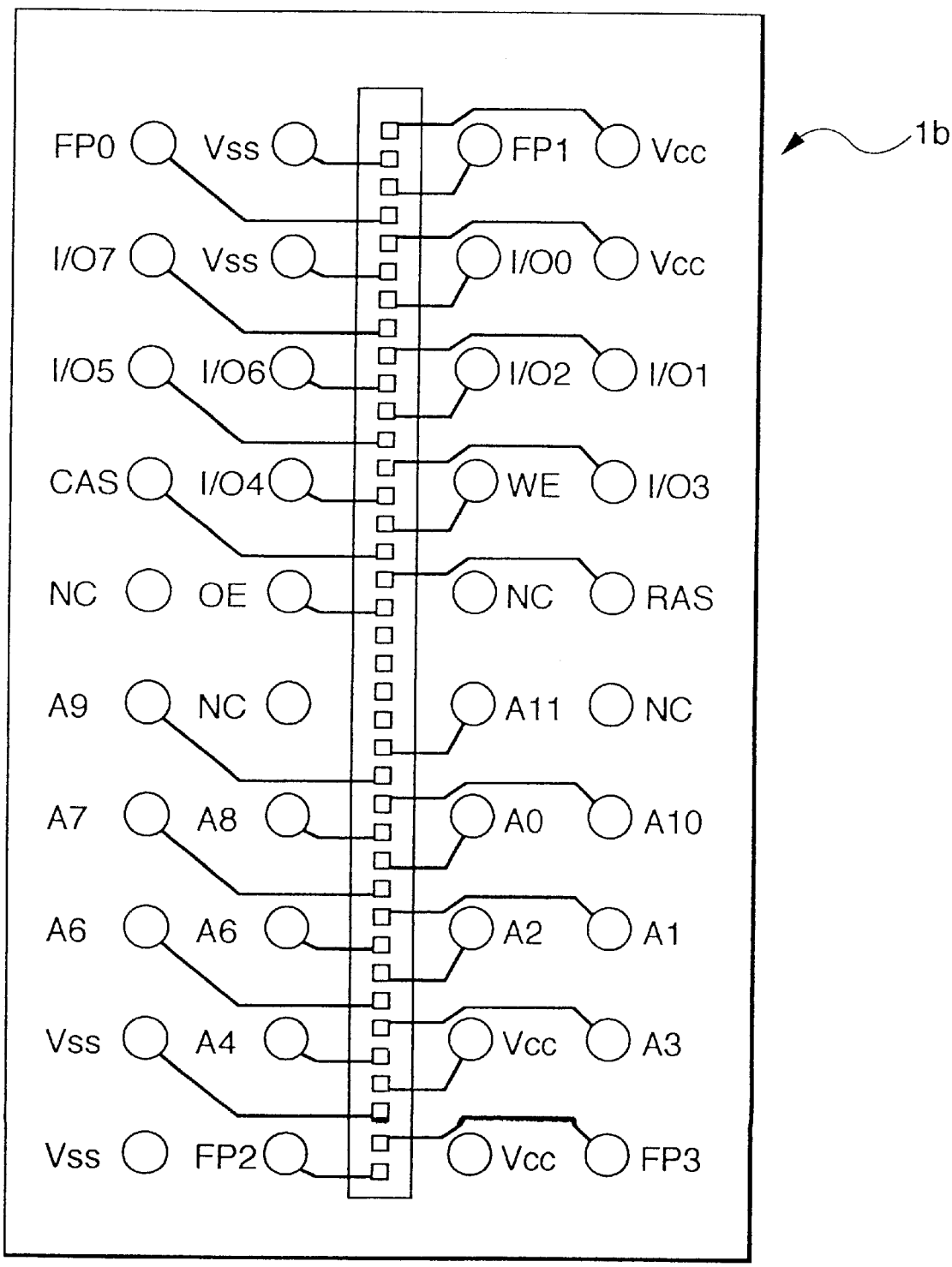
FIG. 17 is a pin arrangement diagram showing a memory according to another mode of an embodiment of the present invention.
Figure 18:
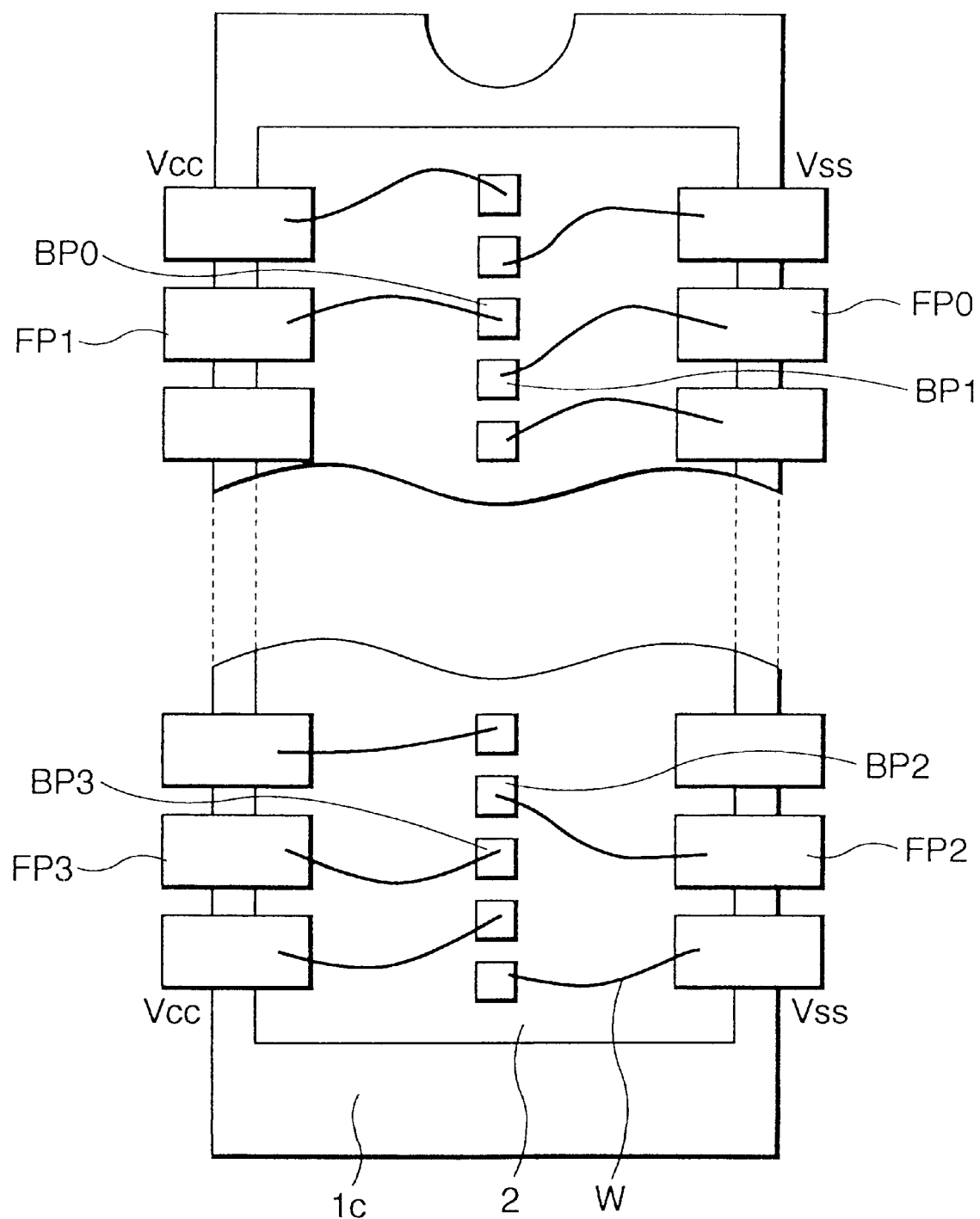
FIG. 18 is a diagrammatic top plan view showing the internal connections of a memory according to another mode of an embodiment of the present invention.

In a CSP type memory 1b, for example, predetermined pins are assigned as the function switching pins FP1 and FP0 for switching the functions and the word structure switching pins FP3 and FP2 for switching the word structures, as shown in FIG. 17.

On the module wiring substrate having those memories 1b mounted thereon, on the other hand, there are also provided the function switching means and the word structure switching means, so that the functions and the word structures can be arbitrarily switched by inputting the function switching signals to the function switching pins FP1 and FP0 and the word structure switching signals to the word structure switching pins FP3 and FP2.

Next, in the SOJ type memory 1c, for example, the predetermined pins are assigned as the function switching pins FP1 and FP0 for switching the functions and the word structure switching pins FP3 and FP2 for switching the word structures. These function switching pins FP1 and FP0 and word structure switching pins FP3 and FP2 are electrically connected bonding wires W with the bonding pads mounted on the semiconductor chips 2, such as the predetermined function switching pads BP1 and BP0 and the word structure switching pads BP3 and BP2, respectively.

On the module wiring substrate for mounting the memories 1c, on the other hand, there are also mounted the function switching means and the word structure switching means, so that the functions and the word structures can be arbitrarily switched by inputting the function switching signals to the function switching pins FP1 and FP0, and the word structure switching signals to the word structure switching pins FP3 and FP2.

Although our invention has been specifically described on the basis of its modes of embodiment, it should not be limited to the aforementioned modes of embodiment but can naturally be modified in various manners without departing from the gist thereof.

In the foregoing Modes 1 and 2, for example, the function switching signals and the word structure switching signals are fed altogether by the function switching means and the word structure switching means to all the memories that are mounted on the memory module. Despite this fact, however, the function switching signals and the word structure switching signals need not be fed altogether to all the memories mounted on the memory module, but the function switching means and the word structure switching means may be provided for every two or three memories.

In the foregoing Modes 1 and 2, on the other hand, the connection destinations are switched by selectively mounting/demounting the conducting chips or the chip parts such as the jumpers or resistors. However, the function switching signals to be inputted to the function switching pins of the memories and the word structure switching signals to be inputted to the word structure switching pins may be selected and switched to the module wiring substrate by using a semiconductor device, such as the EEPROM (electrically erasable programmable read only memory).

In this modification, the predetermined pins of the EEPROM are electrically connected by a wiring pattern with the function switching pins of the individual memories which are mounted on the module wiring substrate.

To the EEPROM there is inputted in advance a program for giving predetermined functions to the individual memories so that the EEPROM switches the functions and the word structures of the memories by setting on the basis of the program the electric levels of predetermined pins, as connected with the function switching pins and the word structure switching pins, to any of the supply voltage, the ground voltage or no connection.

In the foregoing Modes 1 and 2, moreover, when the function switching pins and the word structure switching pins are open, the conducting chips, as connected with the function switching pins, are not mounted. However, this non-connection state may be effected by cutting the non-connected function switching pins and word structure switching pins from the package end portions at the lead cutting step and disconnecting them from the lands for mounting the memories.

In the foregoing Modes 1 and 2, on the other hand, the operations to switch the functions of the memories are effected by the reading modes, including the refresh cycles and the FAST PAGE and EDO modes. However, the various switching operations, such as the DRAM operation modes or the synchronous DRAM operation modes, may be effected from the outside by the function switching means.

Effects of the Invention

The effects to be obtained from the features of the invention, as disclosed herein, will be briefly described in the following.

(1) According to the present invention, the assembly specifications of the memory module can be made common to make it unnecessary to manage the semiconductor device for individual functions.

(2) In accordance with the present invention, on the other hand, the functions of the semiconductor device can be arbitrarily switched even after the memory module is completed, so that the specifications of the printed-wiring substrate can be unified to cope with a change in the specifications flexibly.

(3) In accordance with the present invention, moreover, the functions of the semiconductor device can be easily switched at a low cost by selectively mounting/demounting the conducting means such as the jumpers or resistors.

(4) In the present invention, moreover, thanks to the aforementioned effects (1) to (3), it is possible to drastically improve the product developing efficiency and the productivity of the semiconductor device and to facilitate the product management.

We claim:

1. A process for manufacturing a memory module, comprising:

the step of preparing a semiconductor device for switching a predetermined word structure on the basis of a word structure switching signal, as inputted to word structure switching external terminals, and preparing a plurality of kinds of dedicated printed-wiring substrates corresponding to a plurality of word structures, and selecting one of said dedicated printed-wiring substrates, as corresponding to a demanded word structure of said semiconductor device, from said plurality of kinds of dedicated printed-wiring substrates; and the step of mounting said semiconductor device on the selected one of said dedicated printed-wiring substrates.

2. A process for manufacturing a memory module, comprising:

the step of preparing a semiconductor device for selecting a word structure on the basis of a word structure switching signal, as inputted to word structure switching external terminals, and for selecting a function on the basis of a function switching signal, as inputted to function switching external terminals, wherein function switching means are provided for selecting an arbitrary function switching signal, as inputted to said function switching external terminals by mounting conducting means or not, and preparing a plurality of kinds of dedicated printed-wiring substrates corresponding to a plurality of word structures, and selecting one of said dedicated printed-wiring substrates, as corresponding to a demanded word structure of said semiconductor device, from said plurality of kinds of dedicated printed-wiring substrates;

the step of mounting said semiconductor device on the selected one of said dedicated printed-wiring substrates; and the step of selecting an arbitrary function selectively, with or without said conducting means provided.

3. A process for manufacturing a memory module, comprising:

the step of preparing a semiconductor device for selecting a predetermined word structure on the basis of a word structure switching signal, as inputted to word structure switching external terminals, and for selecting a predetermined function on the basis of a function switching signal, as inputted to function switching external terminals, and preparing a plurality of kinds of dedicated printed-wiring substrates corresponding to the switching operations of a plurality of word structures and a plurality of functions, and selecting one of said dedicated printed-wiring substrates, as corresponding to a demanded word structure of said semiconductor device and the switching operation of the function, from said plurality of kinds of dedicated printed-wiring substrates; and the step of mounting said semiconductor device on the selected one of said dedicated printed-wiring substrates.

4. A process for manufacturing a memory module comprising the steps of:

preparing a plurality of semiconductor devices, each of said plurality of semiconductor devices comprising a plurality of memory cells and an external terminal and being operable by different word structures based on a state of said external terminal;

selecting one of plural kinds of module substrates which have different wiring patterns; and deciding one of said word structures of said plurality of semiconductor devices by mounting said plurality of semiconductor devices on one of module substrates selected by said selecting step.

5. A process for manufacturing a memory module according to claim 4, wherein each of said external terminals of said semiconductor devices is coupled to the wiring pattern of the module substrate selected by said selecting step.

6. A process for manufacturing a memory module comprising steps of:

preparing a plurality of semiconductor devices, each of said plurality of semiconductor devices comprising a plurality of memory cells and an external terminal and being operable by different word structures based on a state of said external terminal;

preparing a module substrate;

mounting said plurality of semiconductor devices on said module substrate; and mounting selecting means for selecting one of said word structures of said plurality of semiconductor devices on said module.

7. A process for manufacturing a memory module according to claim 6, wherein each of said external terminals of said semiconductor devices is coupled to said selecting means.

8. A process for manufacturing a memory module comprising steps of:

preparing a plurality of semiconductor devices, each of said plurality of semiconductor devices comprising a plurality of memory cells and an external terminal and being operable by one of a plurality of accessing operations based on a state of said external terminal;

selecting one of plural kinds of module substrates which have different wiring patterns; and deciding one of said plurality of accessing operations of said plurality of semiconductor devices by mounting said plurality of semiconductor devices on one of module substrates selected by said selecting step.

9. A process for manufacturing a memory module according to claim 8, wherein each of said external terminals of said semiconductor devices is coupled to the wiring pattern of the module substrate selected by said selecting step.

10. A process for manufacturing a memory module comprising steps of:

preparing a plurality of semiconductor devices, each of said plurality of semiconductor devices comprising a plurality of memory cells and an external terminal and being operable by one of a plurality of accessing operations based on a state of said external terminal;

preparing a module substrate;

mounting said plurality of semiconductor devices on said module substrate; and mounting selecting means for selecting one of said accessing operations of said plurality of semiconductor devices on said module.

11. A process for manufacturing a memory module according to claim 10, wherein each of said external terminals of said semiconductor devices is coupled to said selecting means.

* * * * *